(12) United States Patent
Mayuzumi

(10) Patent No.: US 7,819,261 B2
(45) Date of Patent: Oct. 26, 2010

(54) WIDTH-ADJUSTABLE BOARD STORAGE FRAME AND ASSEMBLY METHOD FOR THE SAME

(75) Inventor: Takuji Mayuzumi, Sagamihara (JP)

(73) Assignee: Nix, Inc. (JP)

( * ) Notice: Subject to any disclaimer, the term of this patent is extended or adjusted under 35 U.S.C. 154(b) by 467 days.

(21) Appl. No.: 11/794,897

(22) PCT Filed: Jan. 12, 2006

(86) PCT No.: PCT/JP2006/300277

§ 371 (c)(1),
(2), (4) Date: May 16, 2008

(87) PCT Pub. No.: WO2006/075653

PCT Pub. Date: Jul. 20, 2006

(65) Prior Publication Data

US 2008/0258587 A1    Oct. 23, 2008

(30) Foreign Application Priority Data

Jan. 14, 2005   (JP) .............................. 2005-008400

(51) Int. Cl.
*A47F 7/00* (2006.01)
(52) U.S. Cl. ...................................... 211/26
(58) Field of Classification Search ............ 211/26, 211/41.17, 175, 189, 195, 201; 312/114, 312/257.1, 258, 260, 261–262, 265.1–265.6; 248/354.6–354.7, 351, 354.1; 361/758, 752, 361/756

See application file for complete search history.

(56) References Cited

U.S. PATENT DOCUMENTS 4,761,044 A    8/1988    Akama et al.

(Continued)

FOREIGN PATENT DOCUMENTS

JP    02-045687    3/1990

(Continued)

OTHER PUBLICATIONS

International Search Report for PCT/JP2006/300277 dated Feb. 28, 2006.

*Primary Examiner*—Jennifer E. Novosad
(74) *Attorney, Agent, or Firm*—Studebaker & Brackett PC; Donald R. Studebaker

(57) ABSTRACT

In an adjustable board storage frame, a fixed side plate 5 and a movable side plate 6 that can be moved remaining parallel with the fixed side plate 5 and fixed at a desired position are placed between a top plate 2 and a base plate 3. The adjustable board storage frame includes: pinions 21 and 22 located near the four corners of the movable side plate 6; guide rails 11A and 11B that are located on the inside surfaces of the top plate 2 and the base plate 3 and on which racks 17 and 18 for engaging with the respective pinions 21 and 22 are formed; bosses 35 protruding from positions near where the respective pinions 21 and 22 for the movable side plate 6 are formed; grooves 14 that are formed near the position where the fixed side plate 5 is located on the top plate 2 and the base plate 3, and to which the bosses 35 can be inserted respectively; and connection paths 15 that are connected to the grooves 14 respectively, and where the bosses 35 pass when the movable side plate 6 is moved.

10 Claims, 24 Drawing Sheets

U.S. PATENT DOCUMENTS

| | | | |
|---|---|---|---|
| 5,593,046 A * | 1/1997 | Katsuura et al. | 211/41.15 |
| 5,660,122 A * | 8/1997 | Sickles et al. | 108/193 |
| 6,321,919 B1 * | 11/2001 | Katsuura et al. | 211/41.17 |
| 6,328,169 B1 | 12/2001 | Matsuda et al. | |
| 6,749,072 B2 | 6/2004 | Takano et al. | |
| 6,948,623 B2 * | 9/2005 | Takano | 211/41.1 |

FOREIGN PATENT DOCUMENTS

| | | |
|---|---|---|
| JP | 4-29595 | 7/1992 |
| JP | 08-048388 | 2/1996 |
| JP | 11-026964 | 1/1999 |
| JP | 2002-084081 | 3/2002 |
| JP | 2002-171085 | 6/2002 |
| JP | 2002-179170 | 6/2002 |

* cited by examiner

WIDTH-ADJUSTABLE BOARD STORAGE FRAME AND ASSEMBLY METHOD FOR THE SAME

TECHNICAL FIELD

The present invention relates to a width-adjustable board storage frame that accommodates printed boards to be incorporated into various kinds of electric and electronic equipment, as well as boards used in other industrial fields (such as panels used as architectural materials), and can adjust to changes in the width of the boards. The invention also relates to a method for assembling such a width-adjustable board storage frame.

BACKGROUND ART

Width-adjustable board storage frames that can accommodate boards used in various fields and adjust to changes in the width of the boards have been introduced.

An example of such width-adjustable board storage frames is configured so that two upright side plates are placed opposite to each other and between a top plate and a base plate, which are located with certain space therebetween; one of the side plates is a fixed side plate and the other side plate is a movable side plate that can be moved remaining parallel with the fixed side plate and be fixed at a desired position; and this adjustable board storage frame can adjust to the width size of boards to be contained by moving the movable side plate. This width-adjustable board storage frame is configured so that at least one pinion is placed near each of the four corners of the movable side plate, these pinions rotate together (i.e., rotate in association with each other) and can freely rotate, and guide rails on which racks for engaging with all the pinions are notched are placed on the inside surfaces of the top plate and the base plate perpendicular to the fixed side plate. (See, for example, Patent Document 1).

When assembling this conventional type of width-adjustable board storage frame, if the fixed side plate and struts are first secured to the base plate, the pinions on the movable side plate cannot be aligned easily with the racks. Accordingly, while the movable side plate is held between the top plate and the base plate, position alignment between the four pinions and the racks are performed; the movable side plate is moved shakily and unstably; and after the movable side plate is pressed against the end faces of the racks and their engagement is confirmed, the struts and the fixed side plate are secured to the top plate and the base plate, thereby completing assembly. The fact is that each component is in an unstable during the assembling and it takes a considerable amount of time unless the person assembling the frame is proficient in its assembly.

Therefore, as a method for assembling a width-adjustable board storage frame that can be easily assembled without proficient skills and in reduced assembly time, there is a method for assembling a width-adjustable board storage frame equipped with fixtures that integrally and temporarily secure the fixed side plate and the movable side plate to the top plate and the base plate in such a manner that the movable side plate and the fixed side plate cannot be separated from the top plate and the base plate, so that the fixtures allow the movable side plate and the fixed side plate to be incorporated into the frame and position alignment between these side plates regarding their top and bottom sides to be achieved at the same time. With this width-adjustable board storage frame as well, pinions located at the top, bottom, left, and right sides of the movable side plate and racks allow adjustment of the width of the frame by moving the movable side plate. (See, for example, Patent Document 2).

[Patent Document 1] Japanese Utility Model (Kokoku) Publication No. HEI 4-29595

[Patent Document 2] Japanese Patent Laid-Open (Kokai) Publication No. 2002-179170

DISCLOSURE OF THE INVENTION

Although assembly using the method for assembling the width-adjustable board storage frame described in Patent Document 2 is more simplified than the assembly required for the width-adjustable board storage frame described in Patent Document 1, misalignment between the pinions and the racks at the top, bottom, left, and right sides of the movable side plate still tend to happen easily when assembling the width-adjustable board storage frame, and there is still room for improvement. Once misalignment happens between the pinions and the racks, the problem of inability to move the movable side plate in parallel with the fixed side plate arises.

The present invention aims to improve these conventional width-adjustable board storage frames and their assembly methods. It is an object of the invention to provide: a width-adjustable board storage frame that can not only realize easy assembly, but also realize easy position alignment between pinions and racks during assembly and movement of the movable side plate, the movable side plate always staying parallel with the fixed side plate; and a method for assembling such a width-adjustable board storage frame.

In order to achieve this object, the invention provides an adjustable board storage frame with two upright side plates placed opposite to each other and between a top plate and a base plate that are placed with a certain space therebetween, one of the side plates being a fixed side plate and the other side plate being a movable side plate that can be moved remaining parallel with the fixed side plate and be fixed at a desired position. This adjustable board storage frame includes: pinions located near the four corners of the movable side plate, the pinions rotating together; guide rails located on the inside surfaces of the top plate and the base plate so that the guide rails are placed substantially perpendicular to the fixed side plate, the guide rails having racks to engage with the respective pinions; bosses protruding from near the positions on the movable side plate where the respective pinions are located; grooves that are formed near the positions in the top plate and the base plate where the fixed side plate is placed, and to which the respective bosses can be inserted; and connection paths that are formed in the top plate and the base plate along the respective guide rails and connected to the respective grooves, and through which the bosses pass when the movable side plate is moved.

In the adjustable board storage frame having the above-described configuration, the movable side plate is accurately aligned with respect to the top plate and the base plate by inserting the bosses formed on the movable side plate into the grooves in the top plate and the base plate respectively. Accordingly, position alignment between the pinions and the racks can be achieved easily. After the position alignment, the bosses pass through the connection paths and can move the movable side plate to a desired position.

Also, in the adjustable board storage frame according to the invention, inclined surfaces that gradually protrude from the movable side plate side toward the fixed side plate side and guide the bosses to the grooves can be formed near the grooves where the movable side plate is placed. This configuration allows the bosses to be inserted into the grooves more easily and accurately.

The adjustable board storage frame according to the invention can also be configured so that through-holes extending in parallel with the respective guide rails are formed in the top plate and the base plate, and fixing mechanisms that pass through the respective through-holes, hold the top plate or the base plate tightly with pressure applied from both its front and back sides, and thereby fix the movable side plate to the top plate and the base plate are formed on the movable side plate.

Each of the fixing mechanisms can include: a tension rod that passes through the through-hole, can be moved in the passing-through direction, and has an engagement part at one end of the tension rod for engaging with the top plate or the base plate; a lock lever having a cam that is located at the other end of the tension rod and connected to the tension rod so that the cam can rotate relative to the tension rod, the rotation of the cam causing the tension rod to move in the passing-through direction; and a force-applying member for applying force to the tension rod to move the engagement part of the tension rod away from the top plate or the base plate.

The tension rod can protrude from the movable side plate to have a height that allows a space to be formed between the pinion and the corresponding rack to engage with the pinion in the state where the top plate or the base plate is not held tightly by the fixing mechanism.

Furthermore, the invention provides a method for assembling an adjustable board storage frame with two upright side plates placed opposite to each other and between a top plate and a base plate that are placed with a certain space therebetween, one of the side plates being a fixed side plate and the other side plate being a movable side plate that can be moved remaining parallel with the fixed side plate and be fixed at a desired position. This adjustable board storage frame includes: pinions located near the four corners of the movable side plate, the pinions rotating together; guide rails located on the inside surfaces of the top plate and the base plate so that the guide rails are placed substantially perpendicular to the fixed side plate, the guide rails having racks to engage with the respective pinions; bosses protruding from near the positions on the movable side plate where the respective pinions are located; grooves that are formed near the positions in the top plate and the base plate where the fixed side plate is placed, and to which the respective bosses can be inserted; and connection paths that are formed in the top plate and the base plate along the respective guide rails and connected to the respective grooves, and through which the bosses pass when the movable side plate is moved.

With this method for assembling the adjustable board storage frame, the movable side plate can be accurately aligned with respect to the top plate and the base plate by the simple action of inserting the bosses formed at the end of the movable side plate on its base plate side into the grooves formed in the base plate, pushing down the movable side plate in a direction away from the fixed side plate, using the base plate side of the movable side plate as a supporting point with the bosses inserted in the grooves, then mounting the top plate on the fixed side plate, raising the movable side plate, and inserting the bosses formed at the end of the movable plate on its top plate side into the grooves in the top plate. As a result, position alignment between the pinions and the racks can be achieved easily. Also, after this position alignment, the bosses can pass through the connection paths and move the movable side plate to a desired position.

In the assembly method according to the invention, inclined surfaces that gradually protrude from the movable side plate side toward the fixed side plate side can be formed at least near the grooves in the top plate where the movable side plate is placed, and the assembly method can further include the step of, when raising the movable side plate and inserting the bosses formed at the end of the movable side plate on its top plate side into the grooves in the top plate, moving the bosses along the inclined surfaces and inserting them into the grooves respectively. Since the method includes the step of moving the bosses along the inclined surfaces and inserting the bosses into the grooves respectively, the bosses formed at the end of the movable side plate on its top plate side can be inserted into the grooves more easily.

Concerning the assembly method according to the invention, through-holes extending in parallel with the respective guide rails can be formed in the top plate and the base plate, and the assembly method can further include the step of using fixing members that are formed on the movable side plate and pass through the respective through-holes, to hold the top plate or the base plate tightly with pressure applied from both its front and back sides, thereby fixing the movable side plate at a desired position. In addition to the aforementioned advantageous effects, inclusion of the above-described step makes it possible to secure the movable side plate at a desired position with more certainty.

Furthermore, in the assembly method according to the invention, each of the fixing members can include: a tension rod that passes through the through-hole, can be moved in the passing-through direction, and has an engagement part at one end of the tension rod for engaging with the top plate or the base plate; a lock lever having a cam that is located at the other end of the tension rod and connected to the tension rod so that the cam can rotate relative to the tension rod, the rotation of the cam causing the tension rod to move in the passing-through direction; and a force-applying member for applying force to the tension rod to move the engagement part of the tension rod away from the top plate or the base plate; and the assembly method can further include the step of, when raising the movable side plate, using the force applied by the force-applying member to have the engagement member come into contact with the top plate.

In the assembly method according to the invention, the tension rod can protrude from the movable side plate to have a height that allows a space to be formed between the pinion and the corresponding rack to engage with the pinion in the state where the top plate or the base plate is not held tightly by the fixing member; and the assembly method can further include the step of, when raising the movable side plate, using the force applied by the force-applying member to have the engagement part come into contact with the top plate and forming a space between the pinion and the corresponding rack to engage with the pinion.

Inclusion of the above-described step makes the engagement parts come into contact with the top plate when raising the movable side plate. As a result, in addition to the aforementioned advantageous effects, the movable side plate can be raised without any interference between the racks and the pinions. Incidentally, the force applied by the force-applying members extends the engagement parts to the maximum.

The adjustable board storage frame and its assembly method according to the invention can accurately align the movable side plate with respect to the top plate and the base plate by inserting the bosses formed on the movable side plate into the grooves formed in the top plate and the base plate.

Therefore, not only can assembly be performed easily, but the movable side plate can also be moved always staying parallel with the fixed side plate.

BEST MODE FOR IMPLEMENTING THE INVENTION

An adjustable board storage frame and its assembly method according to preferred embodiments of this invention will be described below in detail with reference to the attached drawings. The embodiments described below are for the purpose of describing this invention, but the invention is not limited only to these embodiments. Accordingly, this invention can be utilized in various ways unless the utilizations depart from the gist of the invention.

FIG. 1 is a perspective view of an adjustable board storage frame according to an embodiment of the invention.

FIG. 2 is a plan view of a top plate, which is a component in the adjustable board storage frame shown in FIG. 1.

FIG. 3 is a perspective view of a movable side plate, which is a component in the adjustable board storage frame shown in FIG. 1.

FIG. 4 is a front view of the movable side plate shown in FIG. 3.

FIG. 5 is an enlarged perspective view of part of the movable side plate shown in FIG. 3.

FIG. 6 is an enlarged sectional view of part of the movable side plate shown in FIG. 3 and shows the state where the top plate is not locked.

FIG. 7 is an enlarged sectional view of part of the movable side plate shown in FIG. 3 and shows the state where the top plate is locked.

FIG. 8 is perspective view of part of the step of assembling the adjustable board storage frame shown in FIG. 1.

FIG. 9 is an enlarged perspective view of part of the adjustable board storage frame shown in FIG. 8 being assembled.

FIG. 10 is a side view of part of the step of assembling the adjustable board storage frame shown in FIG. 1.

FIG. 11 is a side view of part of the step of assembling the adjustable board storage frame shown in FIG. 1.

FIG. 12 is an enlarged sectional view of part of the adjustable board storage frame shown in FIG. 11.

FIG. 13 is a side view of part of the step of assembling the adjustable board storage frame shown in FIG. 1.

FIG. 14 is a side view of part of the step of assembling the adjustable board storage frame shown in FIG. 1.

FIG. 15 is an enlarged sectional view of part of the adjustable board storage frame shown in FIG. 14.

FIG. 16 is a side view of part of the step of assembling the adjustable board storage frame shown in FIG. 1.

FIG. 17 is an enlarged sectional view of part of the adjustable board storage frame shown in FIG. 16.

FIG. 18 is a side view of part of the step of assembling the adjustable board storage frame shown in FIG. 1.

FIG. 19 is an enlarged sectional view of the area in the vicinity of the top plate for the adjustable board storage frame shown in FIG. 18.

FIG. 20 is an enlarged sectional view of the area in the vicinity of the base plate for the adjustable board storage frame shown in FIG. 18.

FIG. 21 is an enlarged perspective view of the area in the vicinity of the base plate for the adjustable board storage frame shown in FIG. 18.

FIG. 22 is an enlarged perspective view of the area in the vicinity of the base plate for the adjustable board storage frame shown in FIG. 18.

As shown in FIGS. 1 to 22, an adjustable board storage frame 1 according to an embodiment of the invention includes: a top plate 2 and a base plate 3 that are placed with a certain space therebetween; a fixed side plate 5 whose upper end is secured to one edge 2A of the top plate 2, whose lower end is secured to one edge 3A of the base plate 3, and which is placed upright between the top plate 2 and the base plate 3; a movable side plate 6 that is placed between the top plate 2 and the base plate 3 and opposite the fixed side plate 5 and can be moved remaining parallel with the fixed side plate 5 and fixed at a desired position; fixing mechanisms 40 that are placed on the movable side plate 6 and secure the movable side plate 6 to the top plate 2 and the base plate 3; and struts 4A and 4B respectively placed at the corners of the top plate 2 and the base plate 3 on the side where the fixed side plate 5 is not placed.

Namely, the adjustable board storage frame 1 according to an embodiment of the invention is a rigid box body completed by the top plate 2, the base plate 3, the fixed side plate 5, and the struts 4A and 4B as shown in FIG. 1.

The top plate 2, made of materials similar to those of the base plate 3 and with a similar configuration, is moldings made of synthetic resins such as plastics (for example, polystyrene, ABS resin, and polyamide). On the bottom surface 2D of the top plate 2 (i.e., the inside surface of the top plate 2 that constitutes the inside surface of the adjustable board storage frame 1 [see FIG. 2]), there are guide rails 11A and 11B that extend from one edge 2A of the top plate 2 toward the opposite edge 2B and that are spaced out and positioned in parallel with each other. On these guide rails 11A and 11B, racks 17 for engaging with pinions 21 (described later in detail) placed on the movable side plate 6, and racks 18 for engaging with pinions 22 are formed.

Also, locking part through-holes 12 through which a locking part 29 formed at the top of a tension rod (described later in detail) provided on the movable side plate 6 can pass are formed on the edge 2A side and outside the guide rails 11A and 11B closer to the edges of the top plate 2 perpendicular to the edge 2A. On the edge 2B side of these locking part through-holes 12, tension rod passage holes 13 that are connected to the locking-part through-holes 12 and through which the tension rods 28 pass are respectively formed along the guide rails 11A and 11B and in parallel with each other.

Grooves 14 (see FIG. 17) into which bosses 35 (described later in detail) formed on the movable side plate 6 can be inserted are formed respectively on the inside surface of the guide rails 11A and 11B and near the edge 2A. An inclined surface 19 for guiding the boss 35 into the groove 14 is formed at the inlet of each groove 14. This inclined surface 19 is configured so that it gradually protrudes from the movable side plate 6 side toward the fixed side plate 5 side. Also, connection paths 15 (see FIG. 17) for allowing the bosses 35 to move along the guide rails 11A and 11B are formed in the top plate 2.

The base plate 3 is made of materials similar to those of the top plate 2 and with a similar configuration. On the top surface 3U of the base plate 3 (i.e., the inside surface of the base plate 3 constituting the inside surface of the adjustable board storage frame 1 [see FIGS. 1, 2, and 9]), the guide rails 11A and 11B, the locking part through-holes 12, the tension rod passage holes 13, the grooves 14, and the connection paths 15 are formed. Incidentally, reference numeral 3A indicates one edge of the base plate 3 corresponding to one edge 2A of the top plate 2, while reference numeral 3B indicates the other edge of the base plate 3 corresponding to the edge 2B of the top plate 2.

The fixed side plate 5 is configured so that there are a large number of parallel grooves 7 in its inside surface; and on the outside surface of the fixed side plate 5, plural unit plates 9 are placed on top of each other and supported by hook-shaped strips 8 that are placed closer to both lengthwise side edges of the fixed side plate 5 and facing opposite each other. Specifically speaking, the fixed side plate 5 is configured by placing the unit plates 9 in the same plane, one unit plate 9 on top of another, and inserting a tongue piece 16 of a hat-shaped member 10 into each of the pair of hook-shaped strips 8, thereby skewering and integrating the plurality of unit plates 9. Incidentally, the hat-shaped members 10 are placed vertically at the fixed side plate 5.

Just like the fixed side plate 5, the movable side plate 6 is configured so that there are a large number of parallel grooves 7 in its inside surface; and on the outside surface of the movable side plate 6, plural unit plates 9 are placed one on top of each other and supported by hook-shaped strips 8 that are placed closer to both lengthwise side edges of the movable side plate 6 and facing opposite each other. Specifically speaking, the movable side plate 6 is configured by placing the unit plates 9 in the same plane, one unit plate 9 on top of another, and inserting the tongue piece 16 of the hat-shaped member 10 into each of the hook-shaped strips 8, thereby skewering and integrating the plurality of unit plates 9. Incidentally, just like in the fixed side plate 5, two hat-shaped members 10 are placed vertically at the movable side plate 6.

Pinions 21 and 22 that rotate together are placed at the upper and lower ends of the two hat-shaped members 10 provided on the movable side plate 6. Each pinion 21 placed at the upper end of the hat-shaped member 10 (i.e., the upper end of the movable side plate 6) engages with the rack 17 on the guide rails 11A and 11B formed at the top plate 2. Each pinion 22 placed at the upper end of the hat-shaped member 10 engages with the rack 18 on the guide rails 11A and 11B formed at the top plate 2. (See FIG. 19.)

On the other hand, each pinion 21 placed at the lower end of the hat-shaped member 10 (i.e., the lower end of the movable side plate 6) engages with the rack 17 on the guide rails 11A and 11B formed at the base plate 3. Each pinion 22 placed at the lower end of the hat-shaped member 10 engages with the rack 18 on the guide rails 11A and 11B formed at the base plate 3. (See FIGS. 20 to 22.)

Specifically speaking, sliders 20 are fixed and attached to each of the upper and lower ends of the hat-shaped members 10 for the movable side plate 6. The two pinions 21 and 22 are placed inside the slider 20 so that their central axes are perpendicular to each other and can freely rotate. The pinions 21 provided inside the two adjacent sliders 4 out of the four sliders 20 in total are connected to each other by one rotational axis 23. Because of this configuration, the sliders 20 and the pinions 21 and 22 are located near the four corners of the movable side plate 6, and the guide rails 11A and 11B are provided correspondingly on the inside surfaces of the top plate 2 and the base plate 3. As a result, combinations of the guide rails 11A and 11B and the sliders 20, the racks 17 and the pinions 21, and the racks 18 and the pinions 22 function to enable smooth parallel movement of the movable side plate 6.

A generally-cylindrical boss 35 that protrudes in a direction opposite that of the pinion 21 is formed on the side wall of each slider 20 where the pinion is located. When the movable side plate 6 is installed upright on the top plate 2 and the base plate 3, each boss 35 can be inserted into the corresponding groove 14 formed in the top plate 2 and the base plate 3. After the bosses 35 are inserted into the grooves 14, they can move through the connection paths 15 formed in the top plate 2 and the base plate 3.

Fixing mechanisms 40 are used to secure the movable side plate 6 to the top plate 2 and the base plate 3 by passing through the respective tension rod through-holes 13 and holding the top plate 2 or the base plate 3 tightly with pressure applied to their front and back surfaces. As shown in FIGS. 6 and 7 in particular, each fixing mechanism 40 includes: a tension rod 28 that passes through the tension rod through-hole 13, can move in the passing-through direction of the tension rod through-hole 13, and is equipped with a locking part 29 at one end of the tension rod 28 to be locked by the top plate 2 or the base plate 3; a lock lever 30 connected via a pin 26 to the other end of the tension rod 28 so that the lock lever 30 can rotate; and a spring member 31 for applying force to the tension rod 28 to move its locking part 29 away from the top plate 2 or the base plate 3.

A cam face 27 is formed around the outside surface of the tension rod 28 so that a simple swivel operation of the lever 30 can move the locking part 29 closer to or away from the top plate 2 or the base plate 3. This tension rod 28 is formed on and protrudes from the movable side plate 6 to have a height that allows a space to be formed between the pinions 21 and 22 and their corresponding racks 17 and 18 to engage with the pinions 21 and 22 in the state where the fixing mechanism 40 does not hold the top plate 2 or the base plate 3 tightly (see FIG. 6).

A method for assembling the adjustable board storage frame 1 according to this embodiment will be described below with reference to the relevant drawings.

The fixed side plate 5 is first secured to one edge 3A of the base plate 3 as shown in FIG. 8. Next, the struts 4A and 4B are secured to the corners of one edge 3B. As shown in FIGS. 10 to 12, the bosses 35 formed on the movable side plate 6 are then inserted respectively into the grooves 14 formed in the base plate 3 in the X direction (vertical direction) as indicated with an arrow in FIG. 12, thereby setting the movable side plate 6 upright on the base plate 3 near the fixed side plate 5. As a result, the phase adjustment between the pinions 21 and 22 and the racks 17 and 18, which are provided on one edge of the movable side plate 6 on its base plate 3 side, can be easily matched with the phase adjustment between the pinions 21 and 22 and the racks 17 and 18, which are provided on the other edge of the movable side plate 6 on its base plate 3 side.

Subsequently, the upper part of the movable side plate 6 is pushed down in the direction indicated with the arrow shown in FIG. 13, and then the top plate 2 is secured to the fixed side plate 5 and the struts 4A and 4B. Next, as shown in FIG. 14 and FIG. 15, the movable side plate 6 is raised in the direction indicated with the arrow and returned to the original state. When this happens, the locking parts 29 of the tension rods 28 provided on the top plate 2 side are pressed against the top plate 2 with force applied by the spring member 31 so as to extend the height of the locking part 29 to the maximum. Accordingly, since the movable side plate 6 is raised in the direction indicated with the arrow in contact with the bottom surface 2D of the top plate 2, the edge 2A of the top plate 2 is slightly pushed up, using the struts 4A and 4B as a support point, and the movable side plate 6 is raised without any interference between the racks 17 and the pinions 21 and between the racks 18 and the pinions 22.

In FIG. 15, reference LR indicates the position where the top surface of the racks 17 is located, and reference LP indicates the position where the top surface of the pinions 21 is located. FIG. 15 shows that there is space L between LR and LP so that no interference occurs between the racks 17 and the pinions 21 when raising the movable side plate 6.

Furthermore, when the movable side plate 6 is raised in the direction indicated with the arrow, each boss 35 moves up along the inclined surface 19 and is guided by the inclined surface 19 and inserted into the groove 14 as indicated with the arrow shown in FIG. 17. This action makes all the pinions 21 and 22 engage with their corresponding racks 17 and 18 at the same rack position, thereby enabling phase adjustment at the top, bottom, left, and right sides of the movable side plate 6.

Next, when the movable side plate 6 in the above-described state is moved toward the struts 4A and 4B, the locking parts 29 of the respective tension rods 28 pass through each of the locking part through-holes 12. When this happens, each locking part 29 is pressed against the top plate 2 with force applied by the spring member 31 to extend the height of the locking plate 29 to the maximum and, therefore, the locking part 29 can be easily made to pass through the locking part through-hole 12.

When the movable side plate 6 is further moved, the tension rods 28 pass through the tension rod through-holes 13. Subsequently, as shown in FIG. 18, the movable side plate 6 is moved to a desired position. At this moment, the pinions 21 and 22 provided on the top, bottom, left, and right sides of the movable side plate 6 engage with their corresponding racks 17 and 18 at the same rack position as shown in FIGS. 19 and 20. Accordingly, the movable side plate 6 moves in parallel with the fixed side plate 5.

Subsequently, the lock levers 30 of the fixing mechanisms 40 are rotated in the directions indicated with the relevant arrows, and the locking parts 29 of the tension rods 28 are made to come into contact with the top plate 2 and the base plate 3, thereby holding the top plate 2 and the base plate 3 tightly with pressure applied to their front and back sides and securing the movable side plate 6 to the top plate 2 and the base plate 3.

As described above, the adjustable board storage frame 1 according to this embodiment can accurately align the movable side plate 6 with respect to the top plate 2 and the base plate 3 by inserting the bosses 35 formed on the movable side plate 6 into the grooves 14 formed in the top plate 2 and the base plate 3. Therefore, not only can assembly be performed easily, but the movable side plate 6 can also be moved always staying parallel with the fixed side plate 5.

Incidentally, the spring member 31 used in this embodiment can be configured, for example, as shown in FIG. 23. The spring 32 shown in FIG. 24 and other configurations may also be employed.

Figure 1:
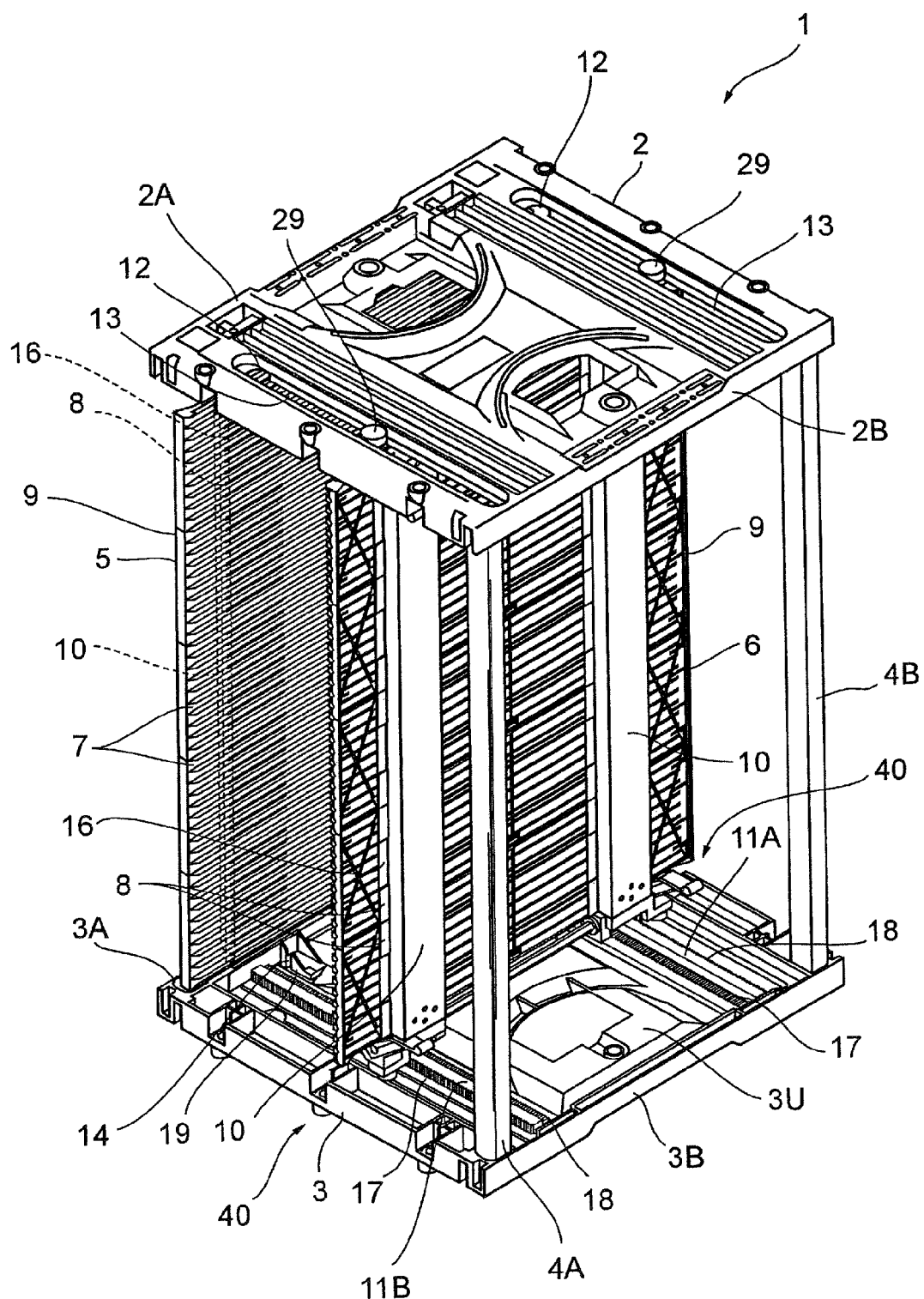
FIG. 1 is a perspective view of an adjustable board storage frame according to an embodiment of the invention.
Figure 2:
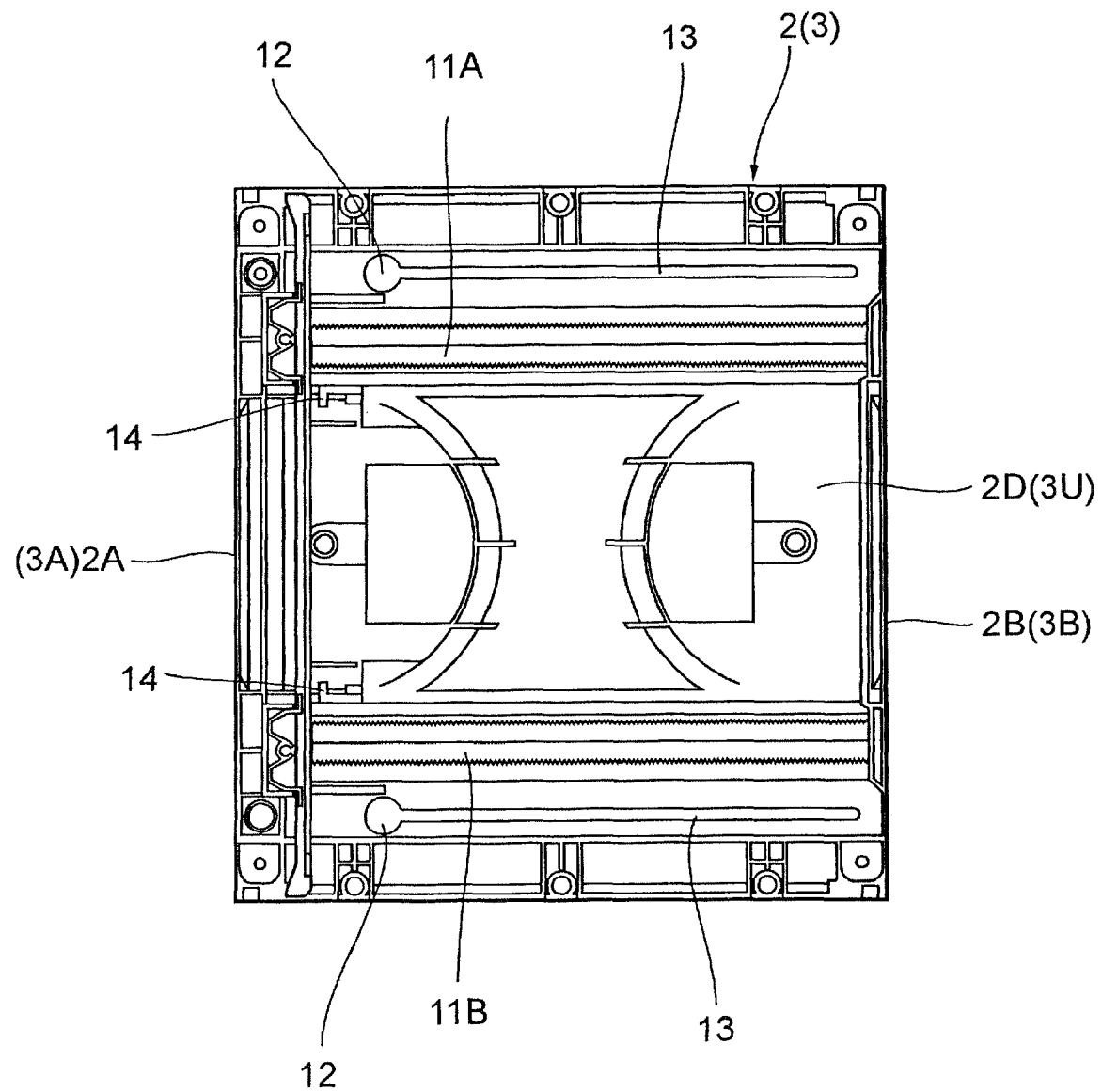
FIG. 2 is a plan view of a top plate, which is a component in the adjustable board storage frame shown in FIG. 1.
Figure 3:
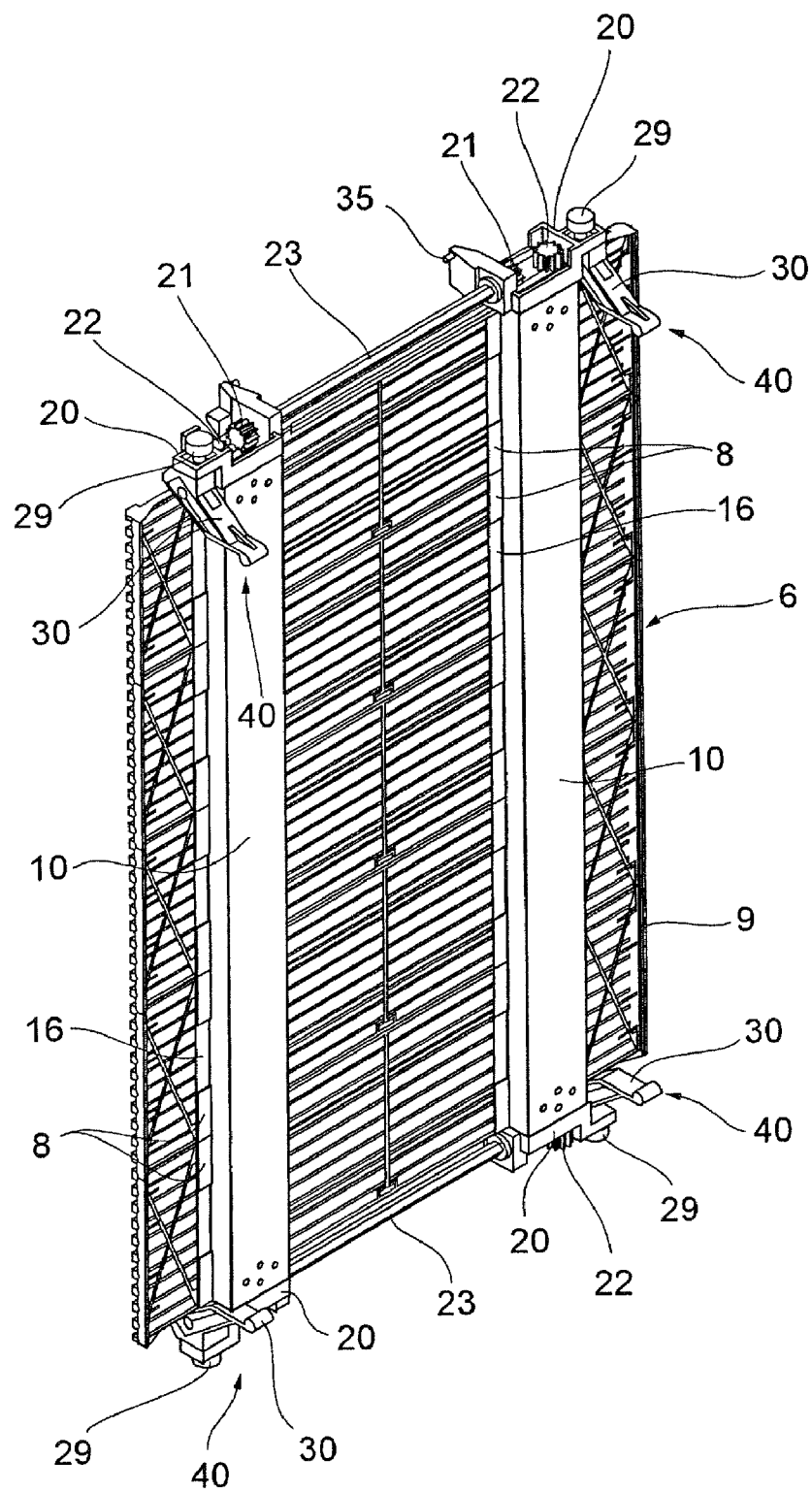
FIG. 3 is a perspective view of a movable side plate, which is a component in the adjustable board storage frame shown in FIG. 1.
Figure 4:
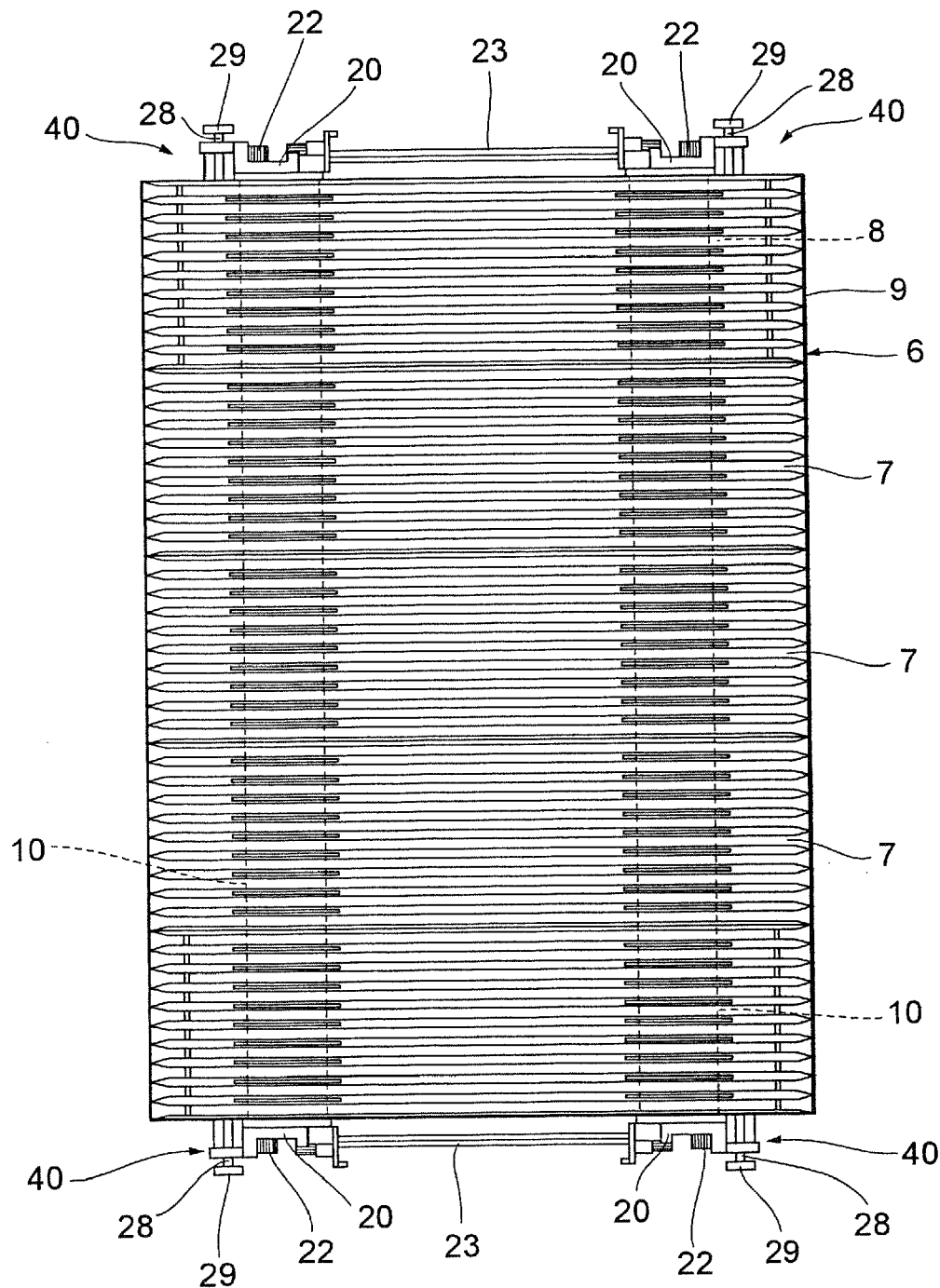
FIG. 4 is a front view of the movable side plate shown in FIG. 3.
Figure 5:
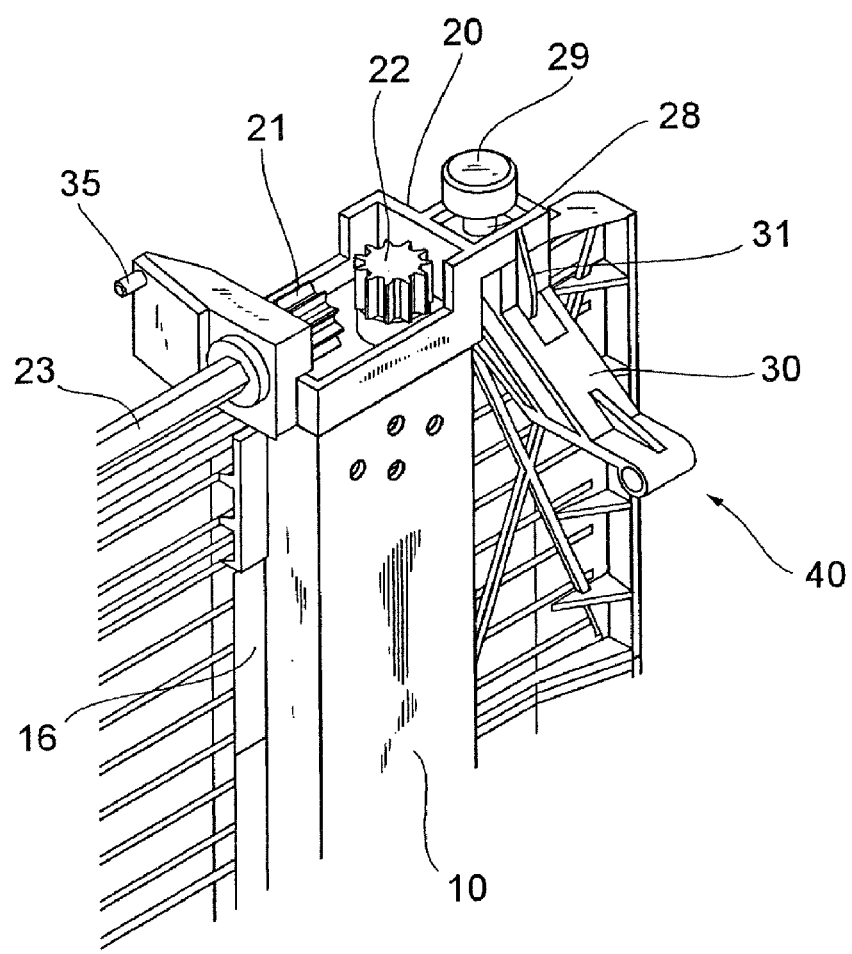
FIG. 5 is an enlarged perspective view of part of the movable side plate shown in FIG. 3.
Figure 6:
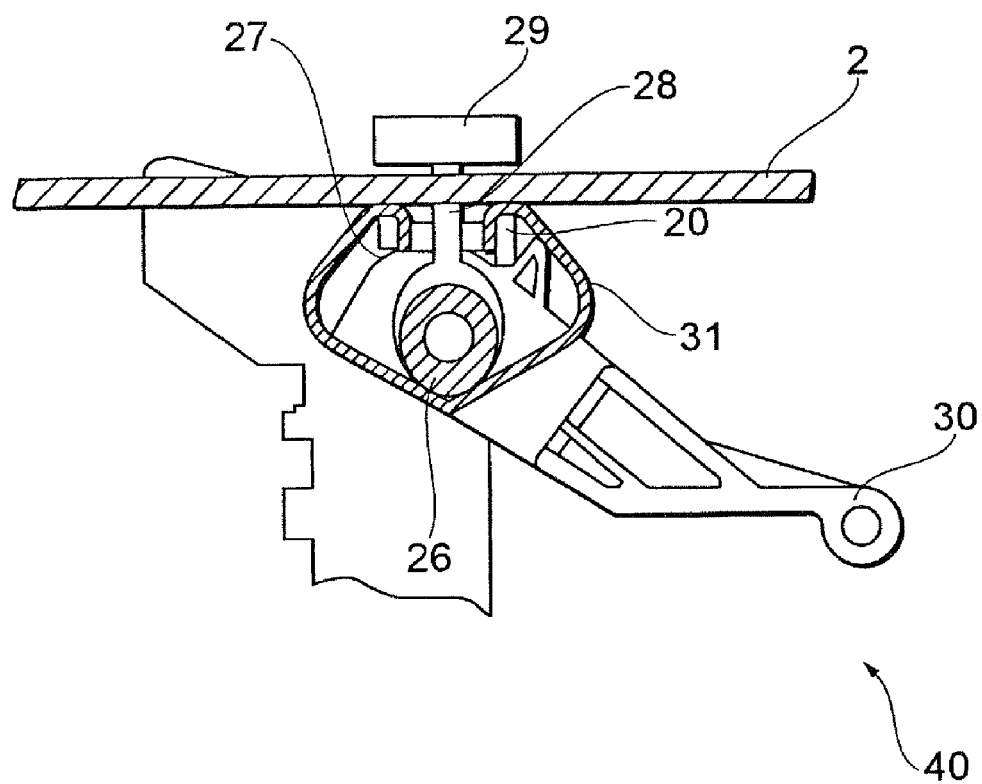
FIG. 6 is an enlarged sectional view of part of the movable side plate shown in FIG. 3 and shows the state where the top plate is not locked.
Figure 7:
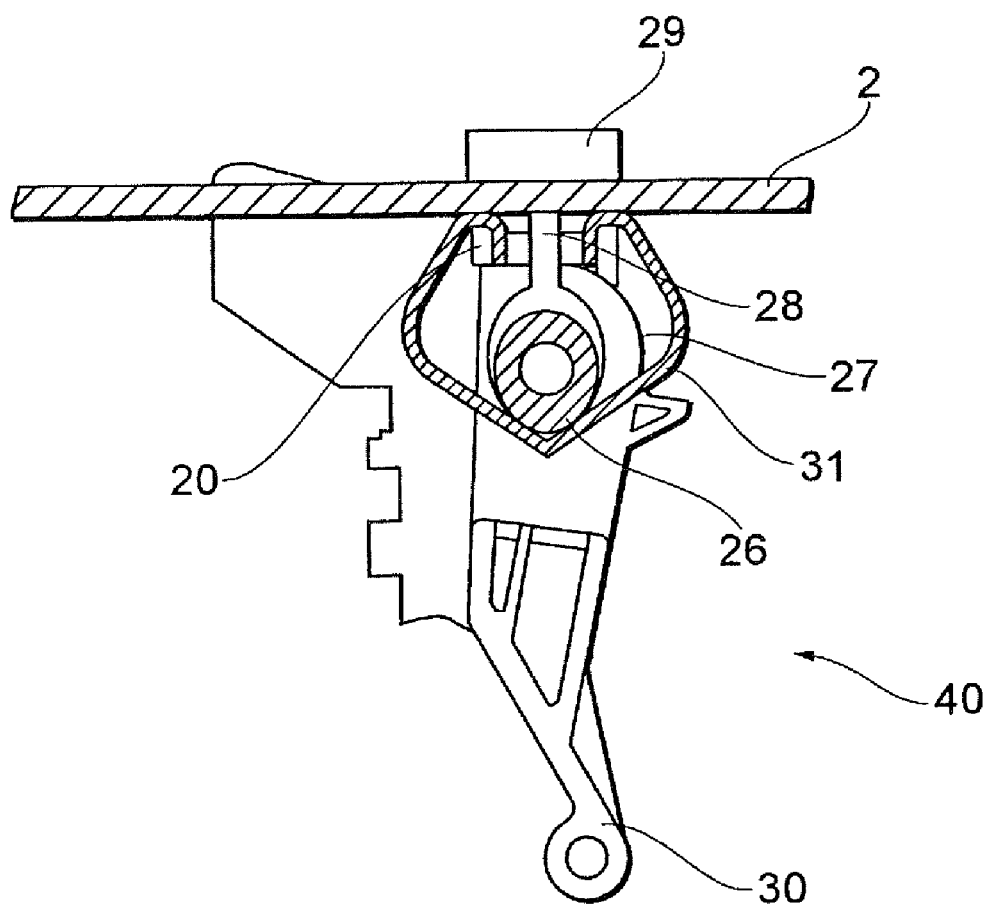
FIG. 7 is an enlarged sectional view of part of the movable side plate shown in FIG. 3 and shows the state where the top plate is locked.
Figure 8:
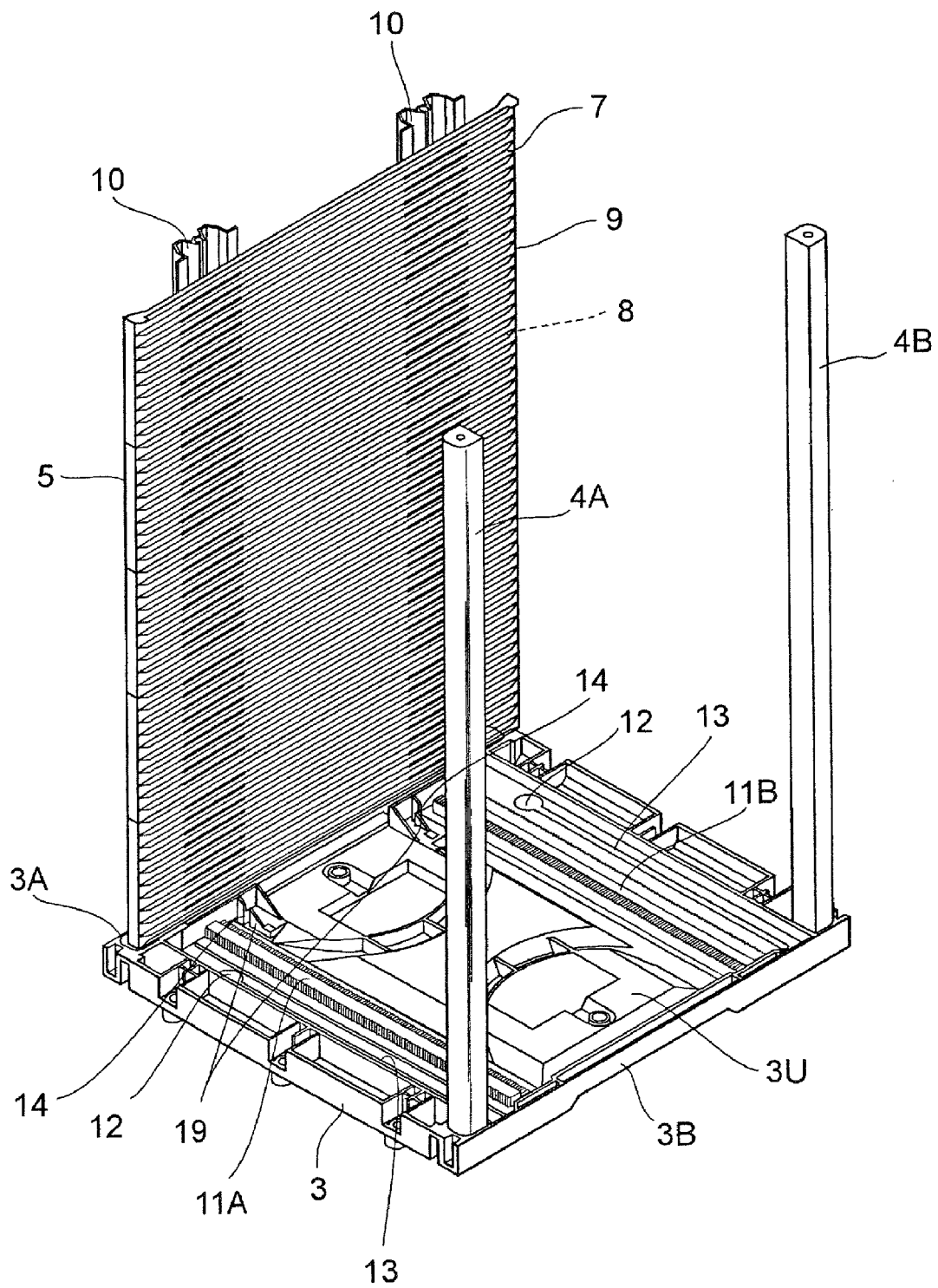
FIG. 8 is a perspective view of part of the step of assembling the adjustable board storage frame shown in FIG. 1.
Figure 9:
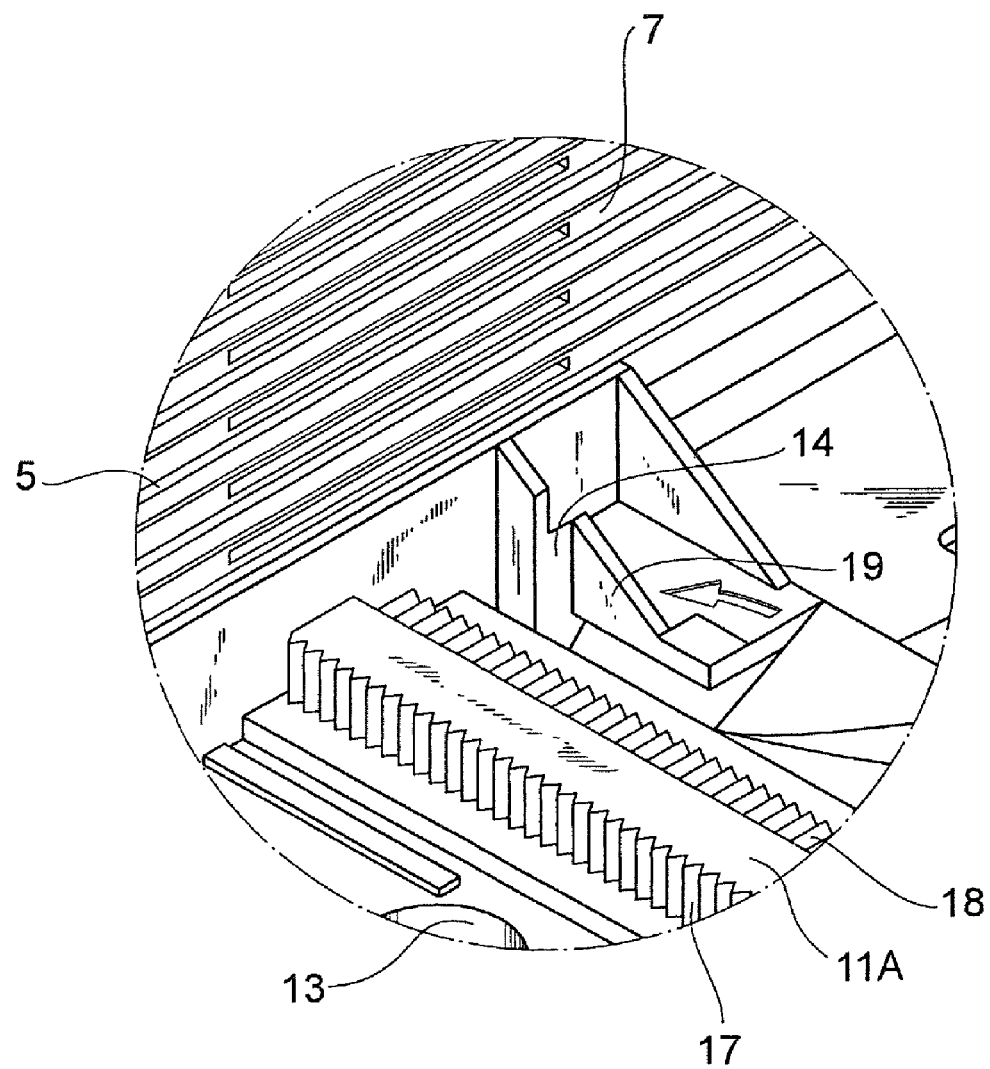
FIG. 9 is an enlarged perspective view of part of the adjustable board storage frame shown in FIG. 8 being assembled.
Figure 10:
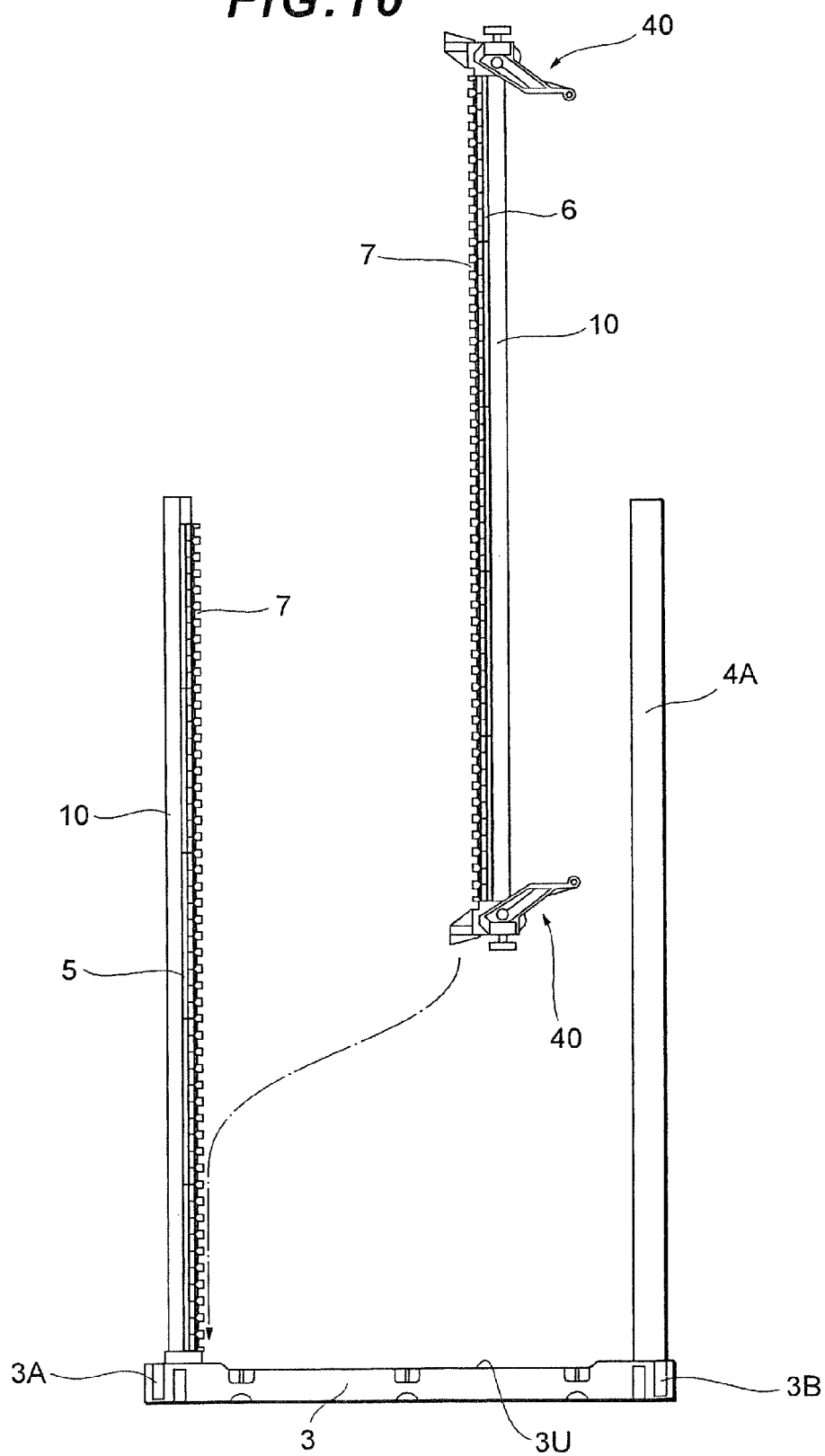
FIG. 10 is a side view of part of the step of assembling the adjustable board storage frame shown in FIG. 1.
Figure 11:
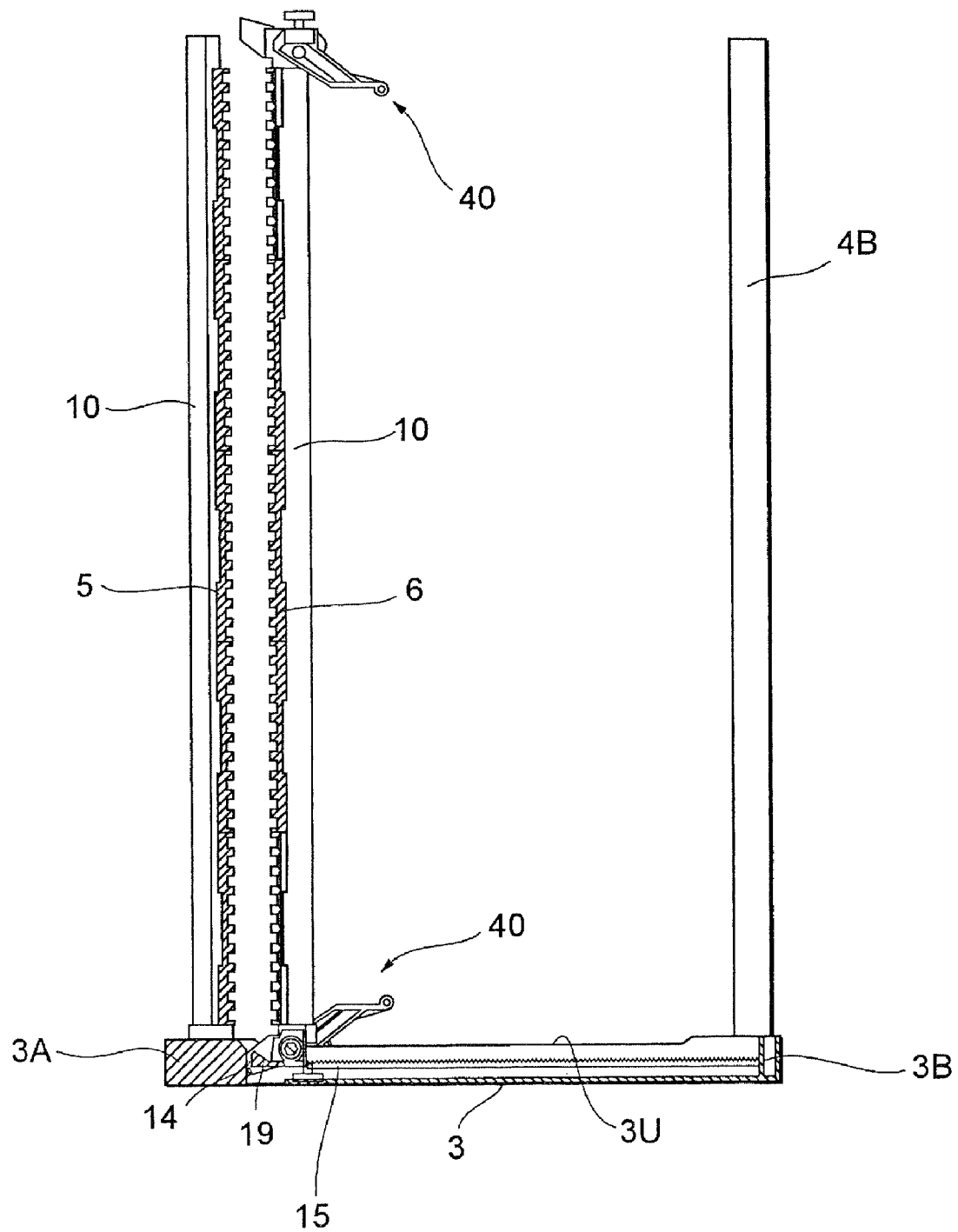
FIG. 11 is a side view of part of the step of assembling the adjustable board storage frame shown in FIG. 1.
Figure 12:
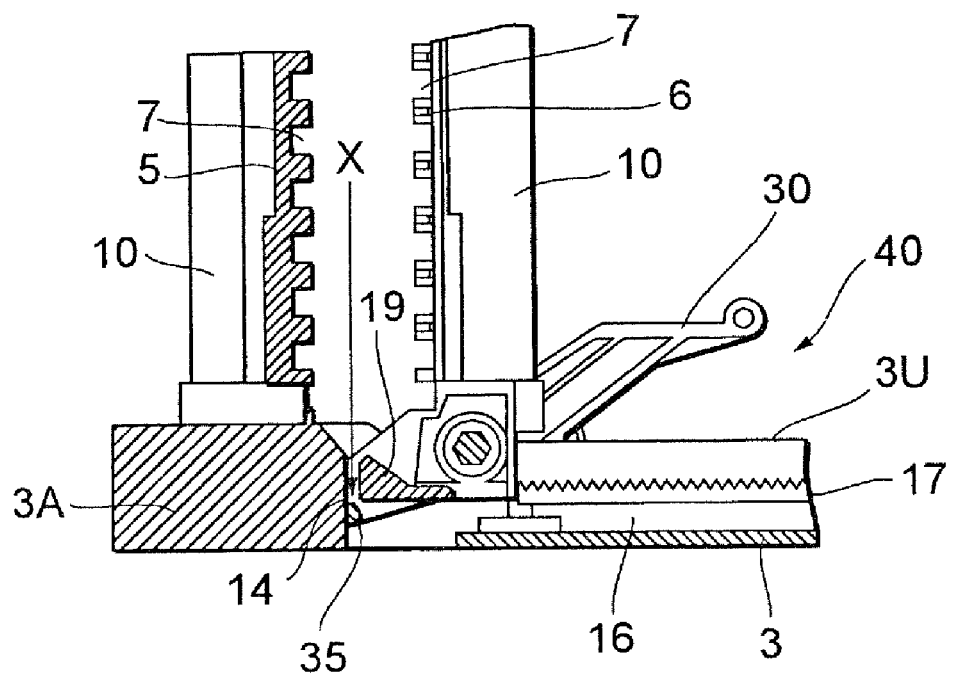
FIG. 12 is an enlarged sectional view of part of the adjustable board storage frame shown in FIG. 11.
Figure 13:
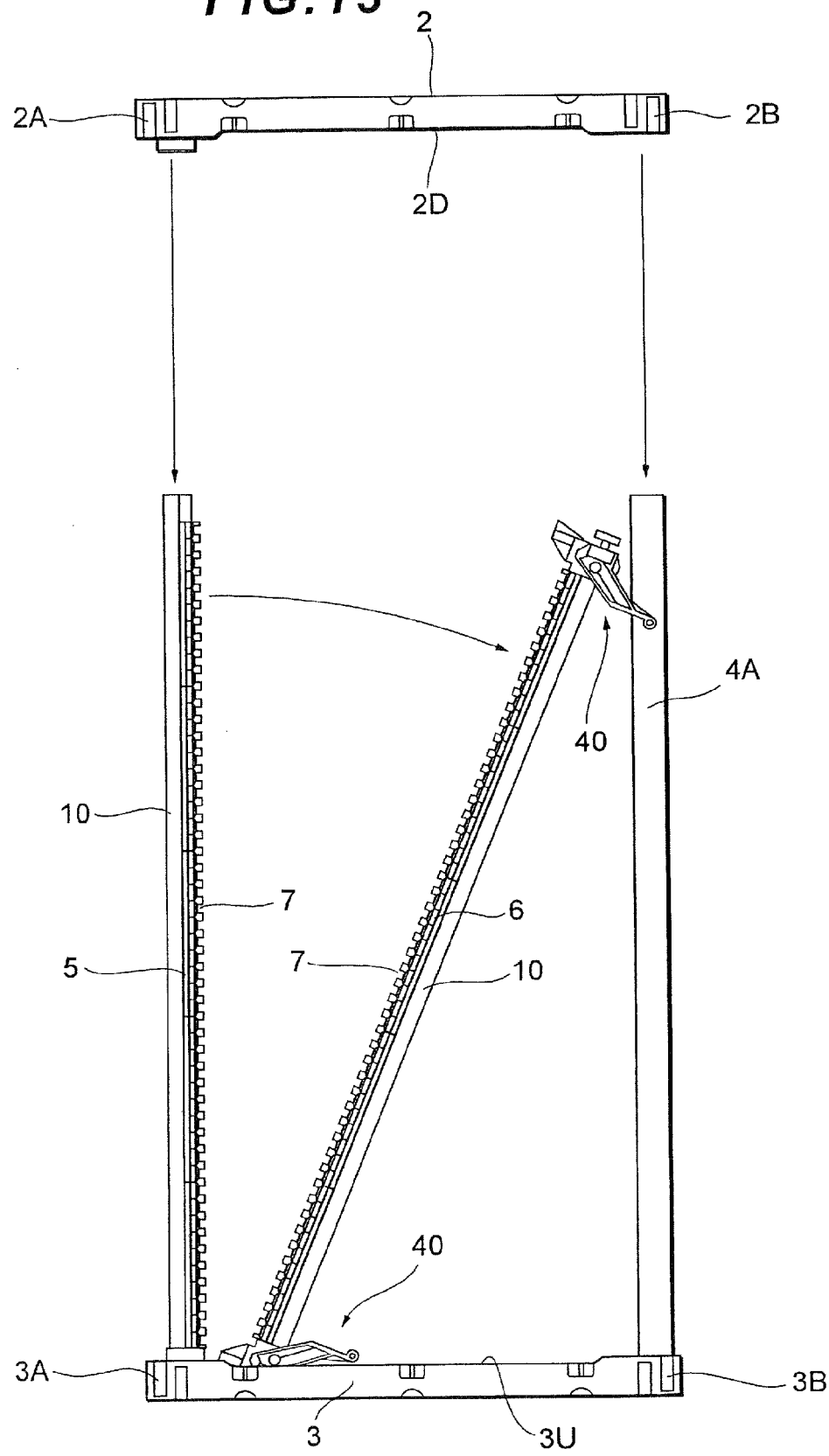
FIG. 13 is a side view of part of the step of assembling the adjustable board storage frame shown in FIG. 1.
Figure 14:
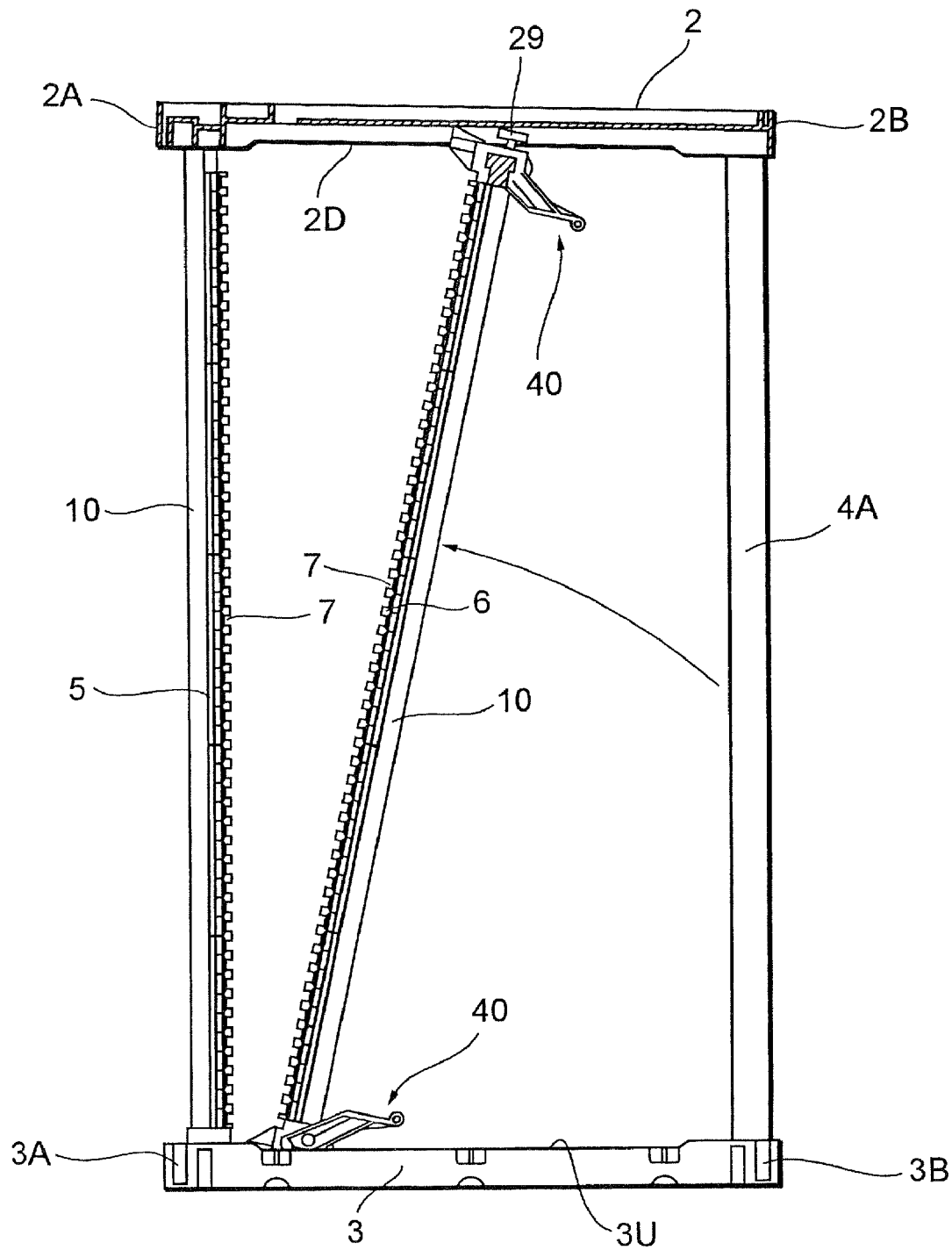
FIG. 14 is a side view of part of the step of assembling the adjustable board storage frame shown in FIG. 1.
Figure 15:
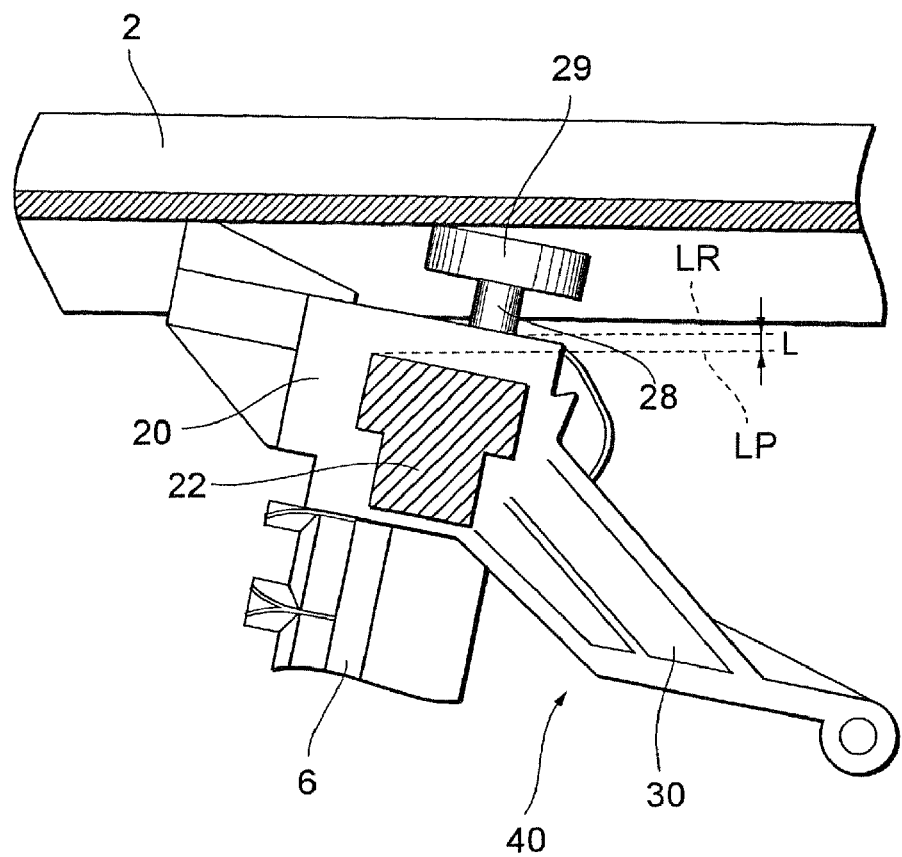
FIG. 15 is an enlarged sectional view of part of the adjustable board storage frame shown in FIG. 14.
Figure 16:
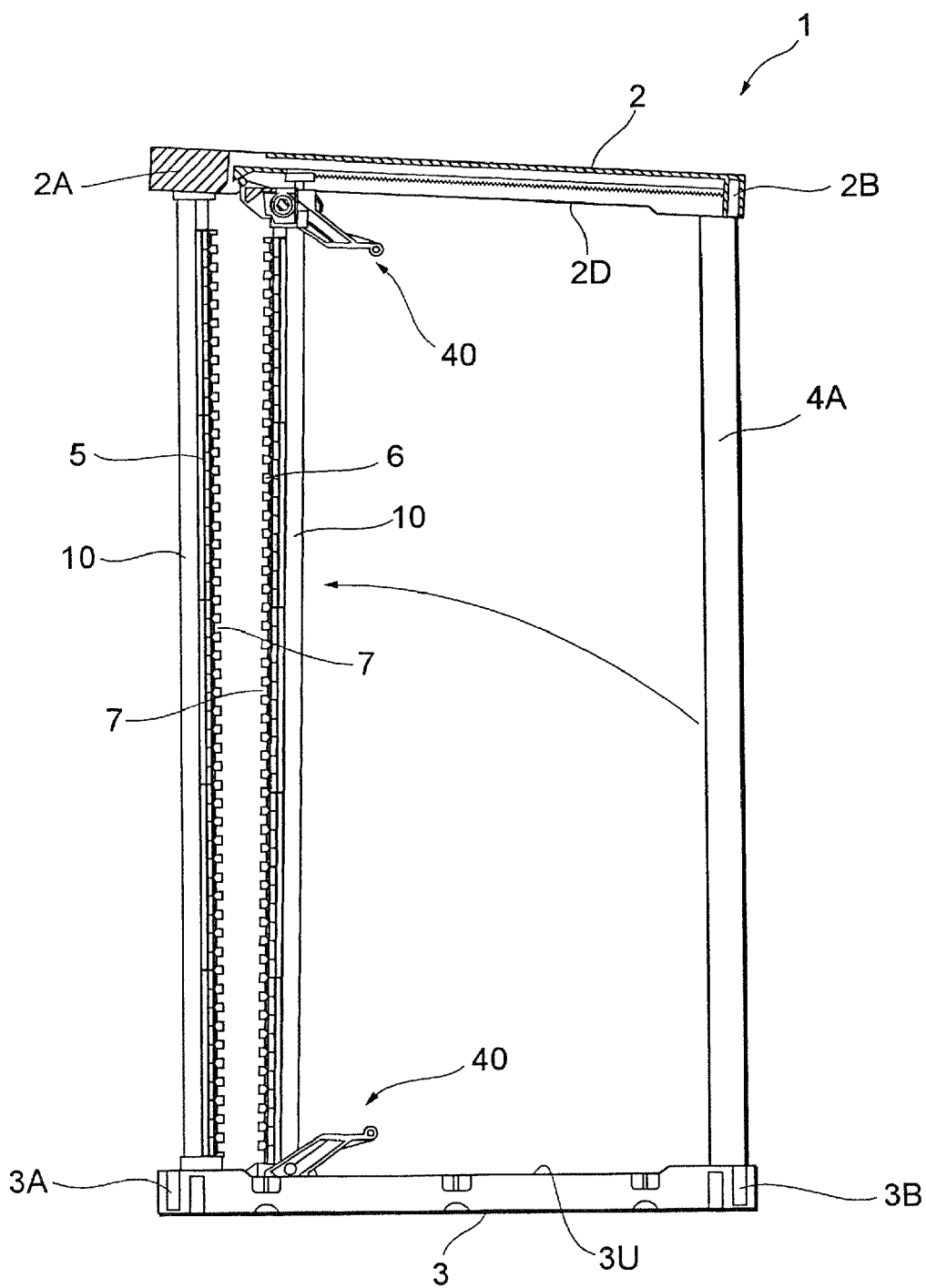
FIG. 16 is a side view of part of the step of assembling the adjustable board storage frame shown in FIG. 1.
Figure 17:
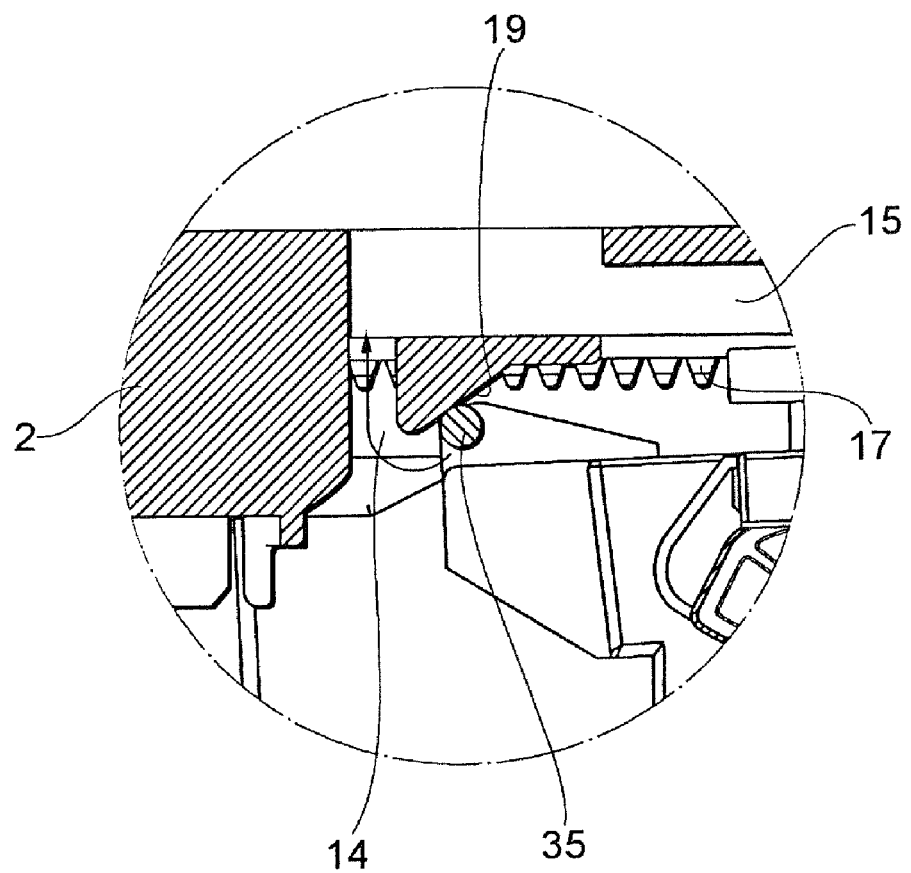
FIG. 17 is an enlarged sectional view of part of the adjustable board storage frame shown in FIG. 16.
Figure 18:
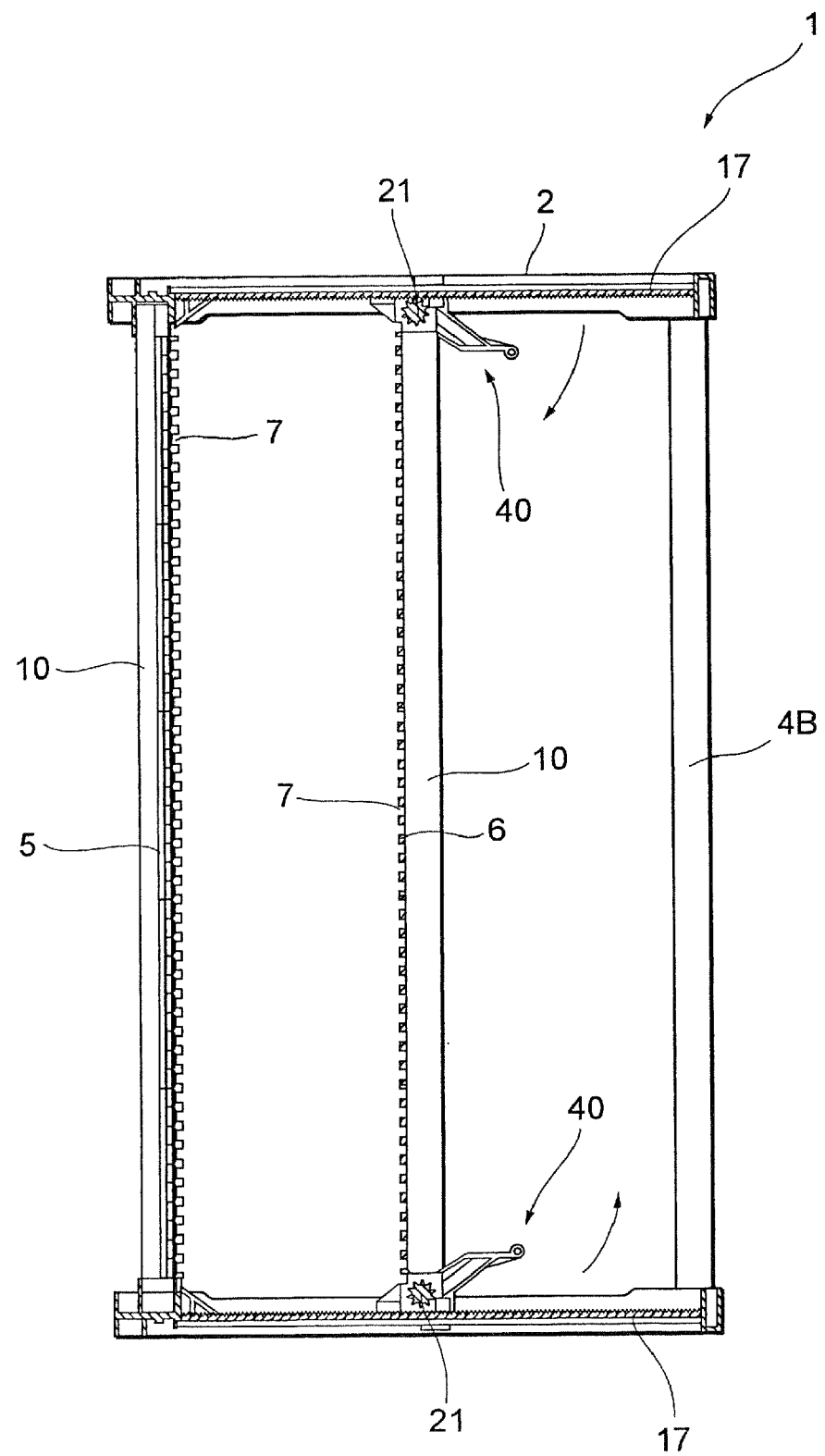
FIG. 18 is a side view of part of the step of assembling the adjustable board storage frame shown in FIG. 1.
Figure 19:
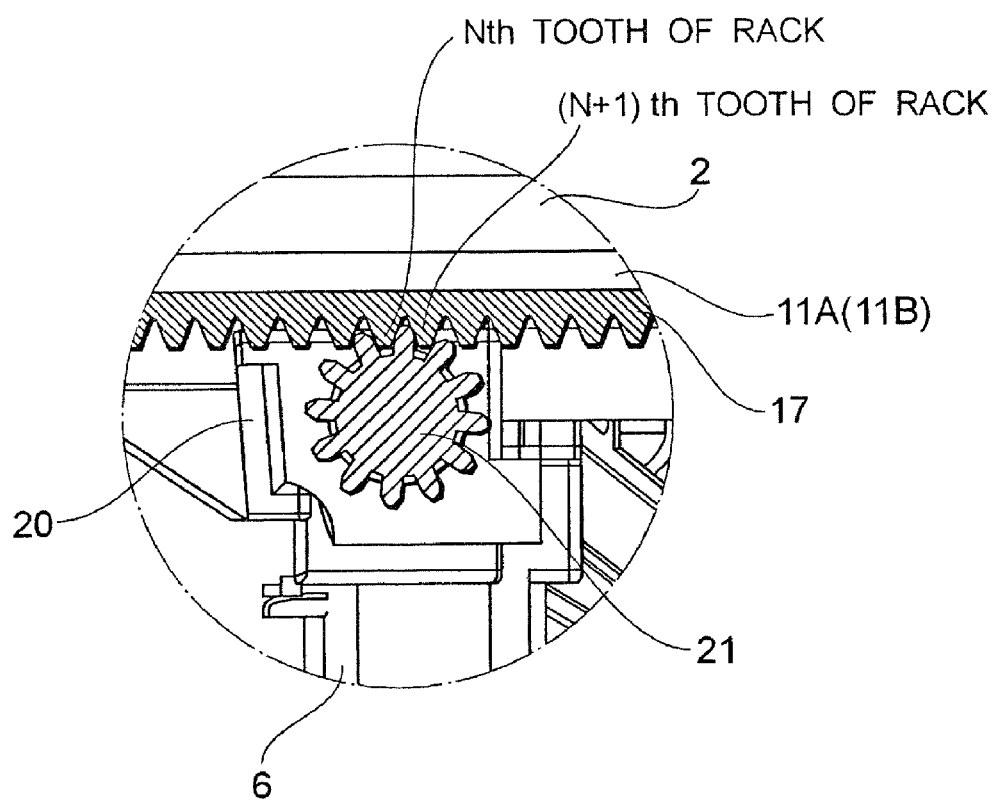
FIG. 19 is an enlarged sectional view of the area in the vicinity of the top plate for the adjustable board storage frame shown in FIG. 18.
Figure 20:
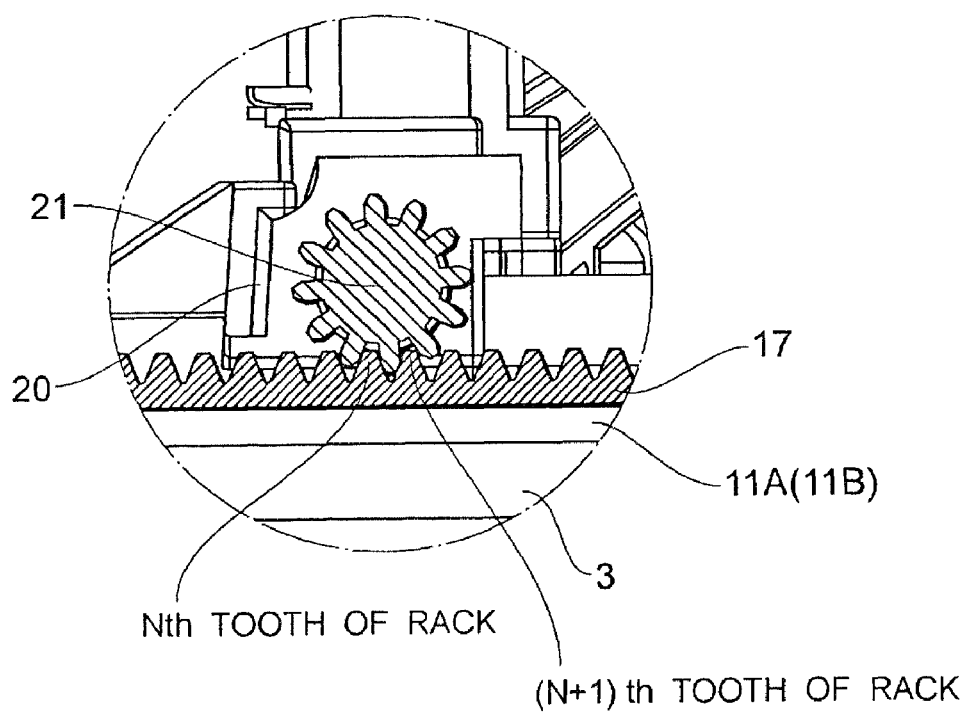
FIG. 20 is an enlarged sectional view of the area in the vicinity of the base plate for the adjustable board storage frame shown in FIG. 18.
Figure 21:
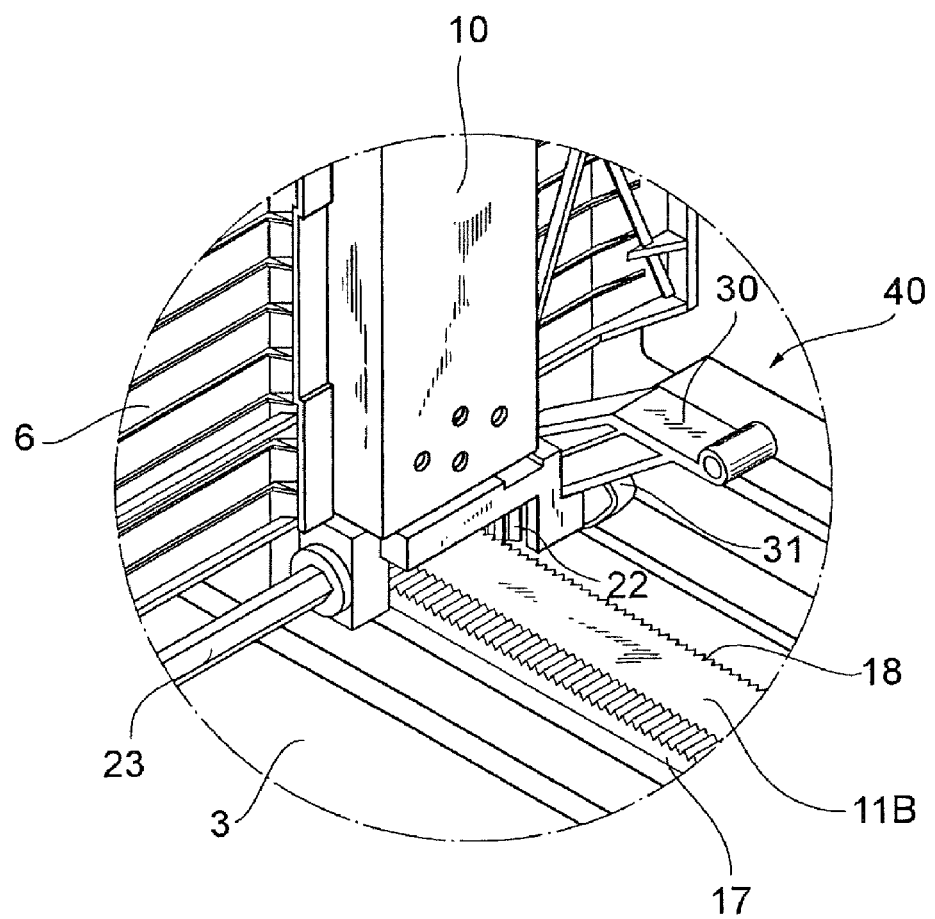
FIG. 21 is an enlarged perspective view of the area in the vicinity of the base plate for the adjustable board storage frame shown in FIG. 18.
Figure 22:
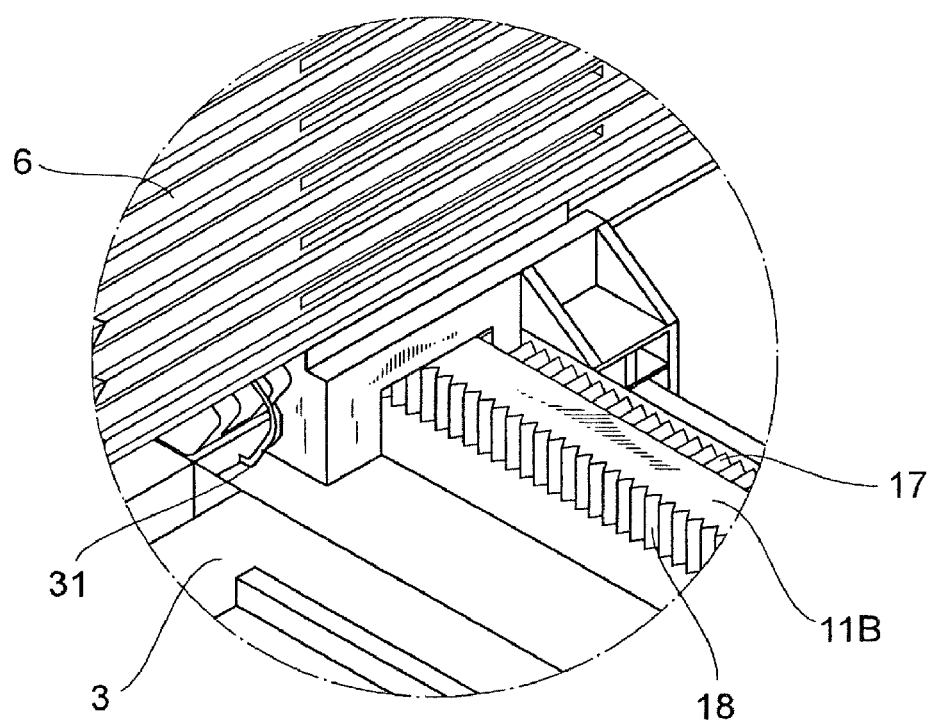
FIG. 22 is an enlarged perspective view of the area in the vicinity of the base plate for the adjustable board storage frame shown in FIG. 18.
Figure 23:
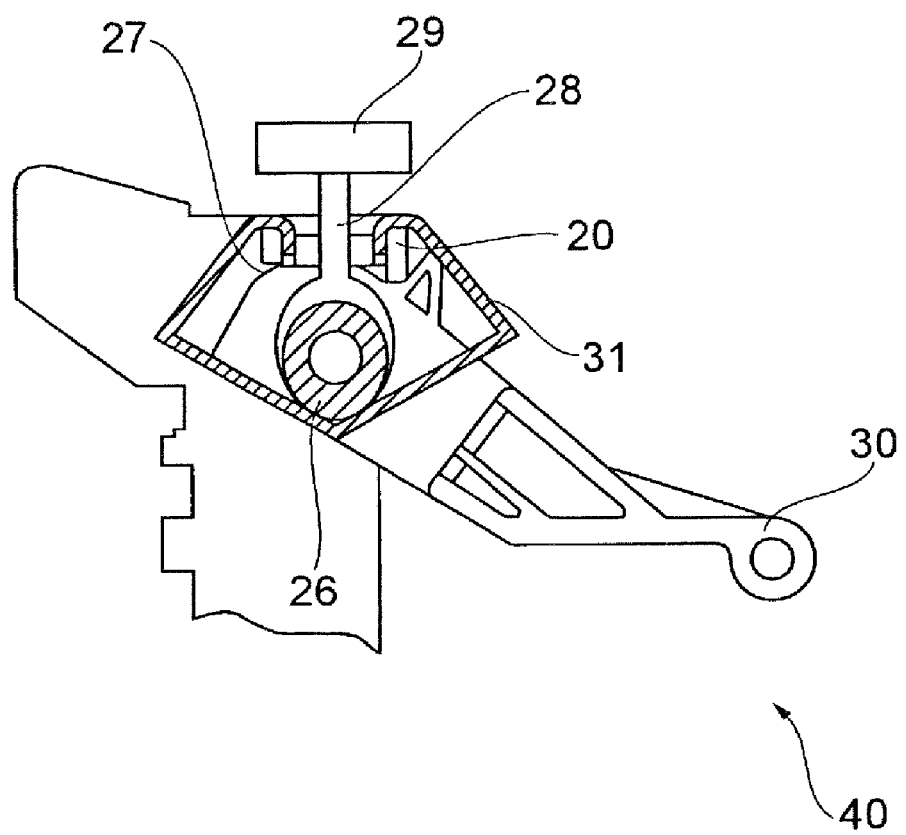
FIG. 23 is an enlarged view of part of an adjustable board storage frame according to another embodiment of the invention.
Figure 24:
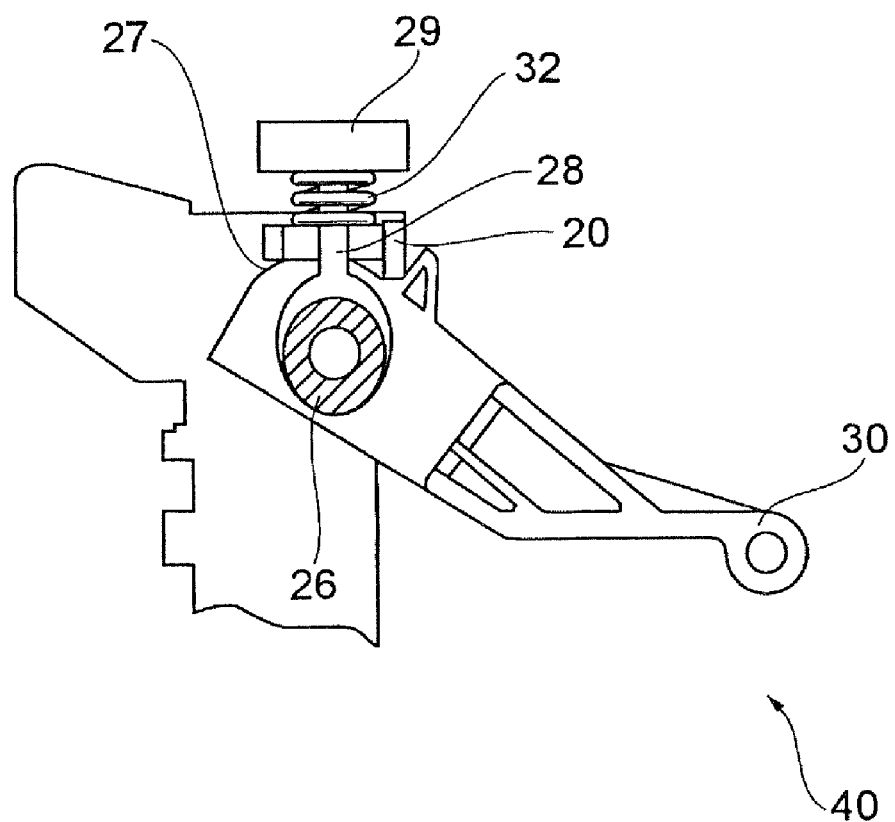
FIG. 24 is an enlarged view of part of an adjustable board storage frame according to another embodiment of the invention.

What is claimed is:

1. An adjustable board storage frame with two upright side plates placed opposite to each other and between a top plate and a base plate that are placed with a certain space therebetween, one of the side plates being a fixed side plate and the other side plate being a movable side plate that can be moved remaining parallel with the fixed side plate and fixed at a desired position, the adjustable board storage frame comprising:
pinions located near the four corners of the movable side plate, the pinions rotating together;
guide rails located on the inside surfaces of the top plate and the base plate so that the guide rails are placed substantially perpendicular to the fixed side plate, the guide rails having racks to engage with the respective pinions;
bosses protruding from near the positions on the movable side plate where the respective pinions are located;
grooves that are formed near the positions in the top plate and the base plate where the fixed side plate is placed, and to which the respective bosses can be inserted; and
connection paths that are formed in the top plate and the base plate along the respective guide rails and connected to the respective grooves, and through which the bosses pass when the movable side plate is moved.

2. The adjustable board storage frame according to claim 1, wherein inclined surfaces that gradually protrude from the movable side plate side toward the fixed side plate side and guide the bosses to the grooves are formed near the grooves where the movable side plate is placed.

3. A method for assembling an adjustable board storage frame with two upright side plates placed opposite to each other and between a top plate and a base plate that are placed with a certain space therebetween, one of the side plates being a fixed side plate and the other side plate being a movable side plate that can be moved remaining parallel with the fixed side plate and fixed at a desired position, the adjustable board storage frame comprising:
pinions located near the four corners of the movable side plate, the pinions rotating together;
guide rails located on the inside surfaces of the top plate and the base plate so that the guide rails are placed substantially perpendicular to the fixed side plate, the guide rails having racks to engage with the respective pinions;
bosses protruding from near the positions on the movable side plate where the respective pinions are located;
grooves that are formed near the positions in the top plate and the base plate where the fixed side plate is placed, and to which the respective bosses can be inserted; and
connection paths that are formed in the top plate and the base plate along the respective guide rails and connected to the respective grooves, and through which the bosses pass when the movable side plate is moved;
the assembly method comprising the steps of:
setting the fixed side plate upright on the base plate;
inserting the bosses formed at the end of the movable side plate on its base plate side, respectively into the grooves in the base plate on which the fixed side plate is set upright, setting the movable side plate upright on the base plate, and placing the movable side plate in parallel with the fixed side plate;
pushing down the movable side plate in a direction away from the fixed side plate, using the base plate side of the movable side plate as a supporting point with the bosses being inserted in the grooves;
mounting the top plate on the fixed side plate with the movable side plate being left pushed down;
after mounting the top plate, raising the movable side plate, inserting the bosses formed at the end of the movable side plate on its top plate side into the grooves in the top plate, and placing the movable side plate in parallel with the fixed side plate; and
having the bosses respectively inserted in the grooves pass through the respective connection paths, moving the movable side plate relative to the fixed side plate, and stopping the movable side plate at a desired position.

4. The adjustable board storage frame assembly method according to claim 3, wherein inclined surfaces that gradually protrude from the movable side plate side toward the fixed side plate side are formed at least near the grooves in the top plate where the movable side plate is placed, and
wherein the assembly method further comprises the step of, when raising the movable side plate and inserting the bosses formed at the end of the movable side plate on its top plate side into the grooves in the top plate, moving the bosses along the inclined surfaces and inserting them into the respective grooves.

5. The adjustable board storage frame according to claim 1 or 2, wherein through-holes extending in parallel with the respective guide rails are formed in the top plate and the base plate, and
fixing mechanisms that pass through the respective through-holes, hold the top plate or the base plate tightly with pressure applied from both its front and back sides, and thereby fix the movable side plate to the top plate and the base plate are formed on the movable side plate.

6. The adjustable board storage frame according to claim 5, wherein each of the fixing mechanisms includes:
a tension rod that passes through the through-hole, can be moved in the passing-through direction, and has an engagement part at one end of the tension rod for engaging with the top plate or the base plate;
a lock lever having a cam that is located at the other end of the tension rod and connected to the tension rod so that the cam can rotate relative to the tension rod, the rotation of the cam causing the tension rod to move in the passing-through direction; and
a force-applying member for applying force to the tension rod to move the engagement part of the tension rod away from the top plate or the base plate.

7. The adjustable board storage frame according to claim 6, wherein the tension rod protrudes from the movable side plate to have a height that allows a space to be formed between the pinion and the corresponding rack to engage with the pinion in the state where the top plate or the base plate is not held tightly by the fixing mechanism.

8. The adjustable board storage frame assembly method according to claim 3 or 4, wherein through-holes extending in parallel with the respective guide rails are formed in the top plate and the base plate, and
The assembly method further comprises the step of using fixing members that are formed on the movable side plate and pass through the through-holes respectively, to hold the top plate or the base plate tightly with pressure applied from both its front and back sides, thereby fixing the movable side plate at a desired position.

9. The adjustable board storage frame assembly method according to claim 8, wherein each of the fixing members includes:
a tension rod that passes through the through-hole, can be moved in the passing-through direction, and has an engagement part at one end of the tension rod for engaging with the top plate or the base plate;
a lock lever having a cam that is located at the other end of the tension rod and connected to the tension rod so that the cam can rotate relative to the tension rod, the rotation of the cam causing the tension rod to move in the passing-through direction; and
a force-applying member for applying force to the tension rod to move the engagement part of the tension rod away from the top plate or the base plate; and
wherein the assembly method further comprises the step of, when raising the movable side plate, using the force applied by the force-applying member to have the engagement member come into contact with the top plate.

10. The adjustable board storage frame assembly method according to claim 9, wherein the tension rod protrudes from the movable side plate to have a height that allows a space to be formed between the pinion and the corresponding rack to engage with the pinion in the state where the top plate or the base plate is not held tightly by the fixing member; and
wherein the assembly method further comprises the step of, when raising the movable side plate, using the force applied by the force-applying member to have the engagement part come into contact with the top plate and forming a space between the pinion and the corresponding rack to engage with the pinion.

* * * * *